United States Patent
Egron et al.

(10) Patent No.: US 9,553,254 B2
(45) Date of Patent: Jan. 24, 2017

(54) AUTOMATED MANUFACTURING PROCESSES FOR PRODUCING DEFORMABLE POLYMER DEVICES AND FILMS

(75) Inventors: Francois Egron, San Francisco, CA (US); Pat Liptawat, Sunnyvale, CA (US); Junfeng Mei, San Jose, CA (US); Hooman Mousavi Nazari, Dale City, CA (US); Xina Quan, Saratoga, CA (US); Marcus A. Rosenthal, San Francisco, CA (US); William D. Sutherland, Los Gatos, CA (US); Chris A. Weaber, Montara, CA (US); Luther L. White, III, Union City, CA (US)

(73) Assignee: Parker-Hannifin Corporation, Cleveland, OH (US)

(*) Notice: Subject to any disclaimer, the term of this patent is extended or adjusted under 35 U.S.C. 154(b) by 567 days.

(21) Appl. No.: 14/002,166

(22) PCT Filed: Mar. 1, 2012
(Under 37 CFR 1.47)

(86) PCT No.: PCT/US2012/027188
§ 371 (c)(1),
(2), (4) Date: Feb. 3, 2014

(87) PCT Pub. No.: WO2012/118916
PCT Pub. Date: Sep. 7, 2012

(65) Prior Publication Data
US 2014/0290834 A1 Oct. 2, 2014

Related U.S. Application Data

(60) Provisional application No. 61/447,832, filed on Mar. 1, 2011, provisional application No. 61/477,709, filed
(Continued)

(51) Int. Cl.
*H01L 41/29* (2013.01)
*H01L 41/25* (2013.01)
(Continued)

(52) U.S. Cl.
CPC ............... *H01L 41/29* (2013.01); *H01L 41/25* (2013.01); *H01L 41/312* (2013.01); *H01L 41/0986* (2013.01); *H01L 41/45* (2013.01)

(58) Field of Classification Search
CPC ......... H01L 41/29; H01L 41/312; H01L 41/25
See application file for complete search history.

(56) References Cited

U.S. PATENT DOCUMENTS

| | | |
|---|---|---|
| 2,430,013 A | 11/1947 | Hansell |
| 2,967,914 A | 1/1961 | Pye |

(Continued)

FOREIGN PATENT DOCUMENTS

| | | |
|---|---|---|
| CA | 2329804 A1 | 11/1999 |
| CA | 2330384 A1 | 11/1999 |

(Continued)

OTHER PUBLICATIONS

WO2012118916 ISR, Sep. 9, 2012, WIPO.*
(Continued)

*Primary Examiner* — David Banh
(74) *Attorney, Agent, or Firm* — K&L Gates LLP

(57) ABSTRACT

A process for producing a patterned deformable polymer film for use in a deformable polymer device is disclosed. The process includes positioning an intermediary layer between a deformable film and a process tooling and printing at least one electrode on the deformable film by depositing an ink to form the at least one electrode on a first surface of the deformable film, wherein the intermediary layer permits release of the deformable film from the process tooling subsequent to the printing process. Films produced by the inventive processes may find use in electroactive polymer devices.

20 Claims, 13 Drawing Sheets

Related U.S. Application Data on Apr. 21, 2011, provisional application No. 61/477,675, filed on Apr. 21, 2011, provisional application No. 61/482,751, filed on May 5, 2011, provisional application No. 61/546,683, filed on Oct. 13, 2011, provisional application No. 61/549,799, filed on Oct. 21, 2011, provisional application No. 61/556,408, filed on Nov. 7, 2011.

(51) Int. Cl.
*H01L 41/312* (2013.01)
*H01L 41/09* (2006.01)
*H01L 41/45* (2013.01)

(56) References Cited

U.S. PATENT DOCUMENTS

| | | |
|---|---|---|
| 3,050,034 A | 8/1962 | Benton |
| 3,056,932 A | 10/1962 | Wood |
| 3,303,750 A | 2/1967 | Powell |
| 3,304,773 A | 2/1967 | Rogallo |
| 3,400,281 A | 9/1968 | Malik |
| 3,403,234 A | 9/1968 | Barnes, Jr. et al. |
| 3,463,942 A | 8/1969 | Mellon |
| 3,509,714 A | 5/1970 | Walton |
| 3,516,846 A | 6/1970 | Matson |
| 3,539,841 A | 11/1970 | Riff |
| 3,558,936 A | 1/1971 | Horan |
| 3,606,241 A | 9/1971 | Bornholdt |
| 3,699,963 A | 10/1972 | Zaffaroni |
| 3,783,480 A | 1/1974 | Booe |
| 3,798,473 A | 3/1974 | Murayama et al. |
| 3,801,839 A | 4/1974 | Yo |
| 3,816,774 A | 6/1974 | Ohnuki et al. |
| 3,821,967 A | 7/1974 | Sturman et al. |
| 3,832,580 A | 8/1974 | Yamamuro et al. |
| 3,851,363 A | 12/1974 | Booe |
| 3,903,733 A | 9/1975 | Murayama et al. |
| 3,935,485 A | 1/1976 | Yoshida et al. |
| 3,940,637 A | 2/1976 | Ohigashi et al. |
| 3,943,614 A | 3/1976 | Yoshikawa et al. |
| 3,947,644 A | 3/1976 | Uchikawa |
| 3,965,757 A | 6/1976 | Barrus |
| 4,011,474 A | 3/1977 | O'Neill |
| 4,028,566 A | 6/1977 | Franssen et al. |
| 4,051,395 A | 9/1977 | Taylor |
| 4,056,742 A | 11/1977 | Tibbetts |
| 4,088,915 A | 5/1978 | Kodama |
| 4,089,927 A | 5/1978 | Taylor |
| 4,127,749 A | 11/1978 | Atoji et al. |
| 4,140,936 A | 2/1979 | Bullock |
| 4,155,950 A | 5/1979 | Berezuk et al. |
| 4,158,787 A | 6/1979 | Forward |
| 4,170,742 A | 10/1979 | Itagaki et al. |
| 4,190,336 A | 2/1980 | Frank et al. |
| 4,216,403 A | 8/1980 | Krempl et al. |
| 4,227,347 A | 10/1980 | Tam |
| 4,234,813 A | 11/1980 | Iguchi et al. |
| 4,236,416 A | 12/1980 | Barcita |
| 4,240,535 A | 12/1980 | Pierce et al. |
| 4,245,815 A | 1/1981 | Willis |
| 4,257,594 A | 3/1981 | Conrey et al. |
| 4,266,339 A | 5/1981 | Kalt |
| 4,283,461 A | 8/1981 | Wooden et al. |
| 4,283,649 A | 8/1981 | Heinouchi |
| 4,284,921 A | 8/1981 | Lemonon et al. |
| 4,290,983 A | 9/1981 | Sasaki et al. |
| 4,297,394 A | 10/1981 | Wooden et al. |
| 4,315,433 A | 2/1982 | Edelman et al. |
| 4,322,877 A | 4/1982 | Taylor |
| 4,326,762 A | 4/1982 | Hockenbrock et al. |
| 4,330,730 A | 5/1982 | Kurz et al. |
| 4,342,936 A | 8/1982 | Marcus et al. |
| 4,344,743 A | 8/1982 | Bessman et al. |
| 4,346,505 A | 8/1982 | Lemonon et al. |
| 4,363,991 A | 12/1982 | Edelman |
| 4,376,302 A | 3/1983 | Miller |
| 4,384,394 A | 5/1983 | Lemonon et al. |
| 4,387,318 A | 6/1983 | Kolm et al. |
| 4,400,634 A | 8/1983 | Micheron |
| 4,401,911 A | 8/1983 | Ravinet et al. |
| 4,404,490 A | 9/1983 | Taylor et al. |
| 4,413,202 A | 11/1983 | Krempl et al. |
| 4,433,359 A | 2/1984 | Hamabe et al. |
| 4,434,452 A | 2/1984 | Hamabe et al. |
| 4,435,667 A | 3/1984 | Kolm et al. |
| 4,442,372 A | 4/1984 | Roberts |
| 4,469,920 A | 9/1984 | Murphy |
| 4,469,978 A | 9/1984 | Hamada et al. |
| 4,472,255 A | 9/1984 | Millington et al. |
| 4,473,806 A | 9/1984 | Johnston |
| 4,500,377 A | 2/1985 | Broussoux et al. |
| 4,518,555 A | 5/1985 | Ravinet et al. |
| 4,566,135 A | 1/1986 | Schmidt |
| 4,588,998 A | 5/1986 | Yamamuro et al. |
| 4,592,383 A | 6/1986 | Rikuta |
| 4,595,338 A | 6/1986 | Kolm et al. |
| 4,598,338 A | 7/1986 | Van Devender et al. |
| 4,605,167 A | 8/1986 | Maehara |
| 4,626,730 A | 12/1986 | Hubbard, Jr. |
| 4,638,207 A | 1/1987 | Radice |
| 4,654,554 A | 3/1987 | Kishi |
| 4,678,955 A | 7/1987 | Toda |
| 4,686,440 A | 8/1987 | Hatamura et al. |
| 4,689,614 A | 8/1987 | Strachan |
| 4,704,556 A | 11/1987 | Kay |
| 4,715,396 A | 12/1987 | Fox |
| 4,733,121 A | 3/1988 | Hebert |
| 4,748,366 A | 5/1988 | Taylor |
| 4,762,733 A | 8/1988 | Thiel et al. |
| 4,783,888 A | 11/1988 | Fujii et al. |
| 4,784,479 A | 11/1988 | Ikemori |
| 4,785,837 A | 11/1988 | Hansen et al. |
| 4,786,837 A | 11/1988 | Kalnin et al. |
| 4,787,411 A | 11/1988 | Moldenhauer |
| 4,793,588 A | 12/1988 | Laverty, Jr. |
| 4,803,671 A | 2/1989 | Rochling et al. |
| 4,814,661 A | 3/1989 | Ratzlaff et al. |
| 4,820,236 A | 4/1989 | Berliner et al. |
| 4,824,107 A | 4/1989 | French |
| 4,825,116 A | 4/1989 | Itoh et al. |
| 4,833,659 A | 5/1989 | Geil et al. |
| 4,835,747 A | 5/1989 | Billet |
| 4,839,872 A | 6/1989 | Gragnolati et al. |
| 4,843,275 A | 6/1989 | Radice |
| 4,849,668 A | 7/1989 | Crawley et al. |
| 4,868,447 A | 9/1989 | Lee et al. |
| 4,869,282 A | 9/1989 | Sittler et al. |
| 4,870,868 A | 10/1989 | Gastgeb et al. |
| 4,877,957 A | 10/1989 | Okada et al. |
| 4,877,988 A | 10/1989 | McGinniss et al. |
| 4,879,698 A | 11/1989 | Langberg |
| 4,885,783 A | 12/1989 | Whitehead et al. |
| 4,885,830 A | 12/1989 | Ohtaka |
| 4,904,222 A | 2/1990 | Gastgeb et al. |
| 4,906,886 A | 3/1990 | Breimesser et al. |
| 4,911,057 A | 3/1990 | Fishman |
| 4,911,995 A | 3/1990 | Belanger et al. |
| 4,958,100 A | 9/1990 | Crawley et al. |
| 4,961,956 A | 10/1990 | Simopoulos et al. |
| 4,969,197 A | 11/1990 | Takaya |
| 4,971,287 A | 11/1990 | Shaw |
| 4,980,597 A | 12/1990 | Iwao |
| 4,989,951 A | 2/1991 | Miyano et al. |
| 5,024,872 A | 6/1991 | Wilson et al. |
| RE33,651 E | 7/1991 | Blonder et al. |
| 5,030,874 A | 7/1991 | Saito et al. |
| 5,048,791 A | 9/1991 | Ellison et al. |
| 5,065,067 A | 11/1991 | Todd et al. |
| 5,076,538 A | 12/1991 | Mohr et al. |
| 5,085,401 A | 2/1992 | Botting et al. |
| 5,090,246 A | 2/1992 | Colla et al. |
| 5,090,794 A | 2/1992 | Hatano et al. |
| 5,100,100 A | 3/1992 | Benson et al. |

(56) References Cited

U.S. PATENT DOCUMENTS

| | | |
|---|---|---|
| 5,119,840 A | 6/1992 | Shibata |
| 5,132,582 A | 7/1992 | Hayashi et al. |
| 5,142,510 A | 8/1992 | Rodda |
| 5,148,735 A | 9/1992 | Veletovac |
| 5,149,514 A | 9/1992 | Sanjurjo |
| 5,153,820 A | 10/1992 | MacFarlane et al. |
| 5,153,859 A | 10/1992 | Chatigny et al. |
| 5,156,885 A | 10/1992 | Budd |
| 5,170,089 A | 12/1992 | Fulton |
| 5,171,734 A | 12/1992 | Sanjurjo et al. |
| 5,172,024 A | 12/1992 | Broussoux et al. |
| 5,188,447 A | 2/1993 | Chiang et al. |
| 5,199,641 A | 4/1993 | Hohm et al. |
| 5,206,557 A | 4/1993 | Bobbio |
| 5,229,979 A | 7/1993 | Scheinbeim et al. |
| 5,232,196 A | 8/1993 | Hutchings et al. |
| 5,240,004 A | 8/1993 | Walinsky et al. |
| 5,244,707 A | 9/1993 | Shores |
| 5,250,784 A | 10/1993 | Muller et al. |
| 5,254,296 A | 10/1993 | Perlman |
| 5,258,201 A | 11/1993 | Munn et al. |
| 5,281,885 A | 1/1994 | Watanabe et al. |
| 5,288,551 A | 2/1994 | Sato et al. |
| 5,291,335 A | 3/1994 | Ogino |
| 5,302,318 A | 4/1994 | Dutta et al. |
| 5,305,178 A | 4/1994 | Binder et al. |
| 5,321,332 A | 6/1994 | Toda |
| 5,350,966 A | 9/1994 | Culp |
| 5,352,574 A | 10/1994 | Guiseppi-Elie |
| 5,356,500 A | 10/1994 | Scheinbeim et al. |
| 5,361,240 A | 11/1994 | Pearce |
| 5,368,704 A | 11/1994 | Madou et al. |
| 5,369,995 A | 12/1994 | Scheinbeim et al. |
| 5,377,258 A | 12/1994 | Bro |
| 5,380,396 A | 1/1995 | Shikida et al. |
| 5,410,210 A | 4/1995 | Sato et al. |
| 5,417,235 A | 5/1995 | Wise et al. |
| 5,424,596 A | 6/1995 | Mendenhall et al. |
| 5,428,523 A | 6/1995 | McDonnal |
| 5,430,565 A | 7/1995 | Yamanouchi et al. |
| 5,438,553 A | 8/1995 | Wilson et al. |
| 5,440,194 A | 8/1995 | Beurrier |
| 5,452,878 A | 9/1995 | Gravesen et al. |
| 5,481,152 A | 1/1996 | Buschulte |
| 5,488,872 A | 2/1996 | McCormick |
| 5,493,372 A | 2/1996 | Mashtare et al. |
| 5,495,137 A | 2/1996 | Park et al. |
| 5,499,127 A | 3/1996 | Tsubota et al. |
| 5,500,635 A | 3/1996 | Mott |
| 5,504,388 A | 4/1996 | Kimura et al. |
| 5,509,888 A | 4/1996 | Miller |
| 5,515,341 A | 5/1996 | Toda et al. |
| 5,548,177 A | 8/1996 | Carroll |
| 5,559,387 A | 9/1996 | Beurrier |
| 5,563,466 A | 10/1996 | Rennex et al. |
| 5,571,148 A | 11/1996 | Loeb et al. |
| 5,578,889 A | 11/1996 | Epstein |
| 5,589,725 A | 12/1996 | Haertling |
| 5,591,986 A | 1/1997 | Niigaki et al. |
| 5,593,462 A | 1/1997 | Gueguen et al. |
| 5,632,841 A | 5/1997 | Hellbaum et al. |
| 5,636,072 A | 6/1997 | Shibata et al. |
| 5,636,100 A | 6/1997 | Zheng et al. |
| 5,642,015 A | 6/1997 | Whitehead et al. |
| 5,647,245 A | 7/1997 | Takei |
| 5,668,703 A | 9/1997 | Rossi et al. |
| 5,678,571 A | 10/1997 | Brown |
| 5,682,075 A | 10/1997 | Bolleman et al. |
| 5,684,637 A | 11/1997 | Floyd |
| 5,696,663 A | 12/1997 | Unami et al. |
| 5,703,295 A | 12/1997 | Ishida et al. |
| 5,717,563 A | 2/1998 | MacDougall et al. |
| 5,722,418 A | 3/1998 | Bro |
| 5,744,908 A | 4/1998 | Kyushima |
| 5,751,090 A | 5/1998 | Henderson |
| 5,755,909 A | 5/1998 | Gailus |
| 5,761,782 A | 6/1998 | Sager |
| 5,766,934 A | 6/1998 | Guiseppi-Elie |
| 5,777,540 A | 7/1998 | Dedert et al. |
| 5,788,468 A | 8/1998 | Dewa et al. |
| 5,800,421 A | 9/1998 | Lemelson |
| 5,801,475 A | 9/1998 | Kimura |
| 5,814,921 A | 9/1998 | Carroll |
| 5,828,157 A | 10/1998 | Miki et al. |
| 5,831,371 A | 11/1998 | Bishop |
| 5,835,453 A | 11/1998 | Wynne et al. |
| 5,847,690 A | 12/1998 | Boie et al. |
| 5,857,694 A | 1/1999 | Lazarus et al. |
| 5,876,675 A | 3/1999 | Kennedy |
| 5,883,466 A | 3/1999 | Suyama et al. |
| 5,889,354 A | 3/1999 | Sager |
| 5,892,314 A | 4/1999 | Sager et al. |
| 5,896,287 A | 4/1999 | Mihara et al. |
| 5,897,097 A | 4/1999 | Biegelsen et al. |
| 5,900,572 A | 5/1999 | Aaroe |
| 5,902,836 A | 5/1999 | Bennett et al. |
| 5,910,107 A | 6/1999 | Iliff |
| 5,912,499 A | 6/1999 | Diem et al. |
| 5,913,310 A | 6/1999 | Brown |
| 5,914,901 A | 6/1999 | Pascucci |
| 5,915,377 A | 6/1999 | Coffee |
| 5,918,502 A | 7/1999 | Bishop |
| 5,928,262 A | 7/1999 | Harber |
| 5,928,547 A | 7/1999 | Shea et al. |
| 5,933,170 A | 8/1999 | Takeuchi et al. |
| 5,971,355 A | 10/1999 | Biegelsen et al. |
| 5,977,685 A | 11/1999 | Kurita et al. |
| 5,984,760 A | 11/1999 | Marine |
| 5,988,902 A | 11/1999 | Holehan |
| 6,012,961 A | 1/2000 | Sharpe, III et al. |
| 6,037,707 A | 3/2000 | Gailus et al. |
| 6,040,356 A | 3/2000 | Kanki et al. |
| 6,048,276 A | 4/2000 | Vandergrift |
| 6,048,622 A | 4/2000 | Hagood, IV et al. |
| 6,055,859 A | 5/2000 | Kozuka et al. |
| 6,059,546 A | 5/2000 | Brenan et al. |
| 6,060,811 A | 5/2000 | Fox et al. |
| 6,069,420 A | 5/2000 | Mizzi et al. |
| 6,074,178 A | 6/2000 | Bishop et al. |
| 6,075,504 A | 6/2000 | Stoller |
| 6,078,126 A | 6/2000 | Rollins et al. |
| 6,084,321 A | 7/2000 | Hunter et al. |
| 6,089,701 A | 7/2000 | Hashizume et al. |
| 6,093,078 A | 7/2000 | Cook |
| 6,093,995 A | 7/2000 | Lazarus et al. |
| 6,094,988 A | 8/2000 | Aindow |
| 6,097,821 A | 8/2000 | Yokoyama et al. |
| 6,108,275 A | 8/2000 | Hughes et al. |
| 6,111,743 A | 8/2000 | Lavene |
| 6,117,396 A | 9/2000 | Demers |
| 6,130,510 A | 10/2000 | Kurihara et al. |
| 6,133,398 A | 10/2000 | Bhat et al. |
| 6,140,131 A | 10/2000 | Sunakawa et al. |
| 6,140,740 A | 10/2000 | Porat et al. |
| 6,140,746 A | 10/2000 | Miyashita et al. |
| 6,148,842 A | 11/2000 | Kappel et al. |
| 6,156,842 A | 12/2000 | Hoenig et al. |
| 6,157,528 A | 12/2000 | Anthony |
| 6,161,966 A | 12/2000 | Chang et al. |
| 6,165,126 A | 12/2000 | Merzenich et al. |
| 6,168,133 B1 | 1/2001 | Heinz et al. |
| 6,181,351 B1 | 1/2001 | Merrill et al. |
| 6,184,044 B1 | 2/2001 | Sone et al. |
| 6,184,608 B1 | 2/2001 | Cabuz et al. |
| 6,184,609 B1 | 2/2001 | Johansson et al. |
| 6,184,844 B1 | 2/2001 | Filipovic et al. |
| 6,190,805 B1 | 2/2001 | Takeuchi et al. |
| 6,194,815 B1 | 2/2001 | Carroll |
| 6,196,935 B1 | 3/2001 | Spangler et al. |
| 6,198,203 B1 | 3/2001 | Hotomi |
| 6,198,204 B1 | 3/2001 | Pottenger |
| 6,201,398 B1 | 3/2001 | Takada |
| 6,210,827 B1 | 4/2001 | Dopp et al. |
| 6,228,533 B1 | 5/2001 | Ohashi et al. |

(56) References Cited

U.S. PATENT DOCUMENTS

| | | |
|---|---|---|
| 6,232,702 B1 | 5/2001 | Newnham et al. |
| 6,239,535 B1 | 5/2001 | Toda et al. |
| 6,239,536 B1 | 5/2001 | Lakin |
| 6,240,814 B1 | 6/2001 | Boyd et al. |
| 6,248,262 B1 | 6/2001 | Kubotera et al. |
| 6,249,076 B1 | 6/2001 | Madden et al. |
| 6,252,221 B1 | 6/2001 | Kaneko et al. |
| 6,252,334 B1 | 6/2001 | Nye et al. |
| 6,252,336 B1 | 6/2001 | Hall |
| 6,255,758 B1 | 7/2001 | Cabuz et al. |
| 6,262,516 B1 | 7/2001 | Fukuda et al. |
| 6,268,219 B1 | 7/2001 | McBride et al. |
| 6,282,074 B1 | 8/2001 | Anthony |
| 6,284,435 B1 | 9/2001 | Cao |
| 6,286,961 B1 | 9/2001 | Ogawa |
| 6,291,155 B1 | 9/2001 | Raguse et al. |
| 6,291,928 B1 | 9/2001 | Lazarus et al. |
| 6,294,859 B1 | 9/2001 | Jaenker |
| 6,297,579 B1 | 10/2001 | Martin et al. |
| 6,311,950 B1 | 11/2001 | Kappel et al. |
| 6,316,084 B1 | 11/2001 | Claus et al. |
| 6,319,019 B1 * | 11/2001 | Kwon ............... G02F 1/13452 174/117 FF |
| 6,321,428 B1 | 11/2001 | Toda et al. |
| 6,330,463 B1 | 12/2001 | Hedrich |
| 6,333,595 B1 | 12/2001 | Horikawa et al. |
| 6,334,673 B1 | 1/2002 | Kitahara et al. |
| 6,336,367 B1 | 1/2002 | Raisanen |
| 6,336,880 B1 | 1/2002 | Agner |
| 6,339,527 B1 | 1/2002 | Farooq et al. |
| 6,343,129 B1 | 1/2002 | Pelrine et al. |
| 6,345,840 B1 | 2/2002 | Meyer et al. |
| 6,349,141 B1 | 2/2002 | Corsaro |
| 6,355,185 B1 | 3/2002 | Kubota |
| 6,358,021 B1 | 3/2002 | Cabuz |
| 6,359,370 B1 | 3/2002 | Chang |
| 6,366,193 B2 | 4/2002 | Duggal et al. |
| 6,369,954 B1 | 4/2002 | Berge et al. |
| 6,375,857 B1 | 4/2002 | Ng et al. |
| 6,376,971 B1 | 4/2002 | Pelrine et al. |
| 6,377,383 B1 | 4/2002 | Whitehead et al. |
| 6,379,393 B1 | 4/2002 | Mavroidis et al. |
| 6,379,809 B1 | 4/2002 | Simpson et al. |
| 6,385,021 B1 | 5/2002 | Takeda et al. |
| 6,385,429 B1 | 5/2002 | Weber et al. |
| 6,388,043 B1 | 5/2002 | Langer et al. |
| 6,388,553 B1 | 5/2002 | Shea et al. |
| 6,388,856 B1 | 5/2002 | Anthony |
| 6,400,065 B1 | 6/2002 | Toda et al. |
| 6,404,107 B1 | 6/2002 | Lazarus et al. |
| 6,411,009 B2 | 6/2002 | Jaenker |
| 6,411,013 B1 | 6/2002 | Horning |
| 6,424,079 B1 | 7/2002 | Carroll |
| 6,429,573 B2 | 8/2002 | Koopmann et al. |
| 6,429,576 B1 | 8/2002 | Simes |
| 6,433,689 B1 | 8/2002 | Hovind et al. |
| 6,434,245 B1 | 8/2002 | Zimmermann |
| 6,435,840 B1 | 8/2002 | Sharma et al. |
| 6,436,531 B1 | 8/2002 | Kollaja et al. |
| 6,437,489 B1 | 8/2002 | Shinke et al. |
| 6,457,697 B1 | 10/2002 | Kolze |
| 6,459,088 B1 | 10/2002 | Yasuda et al. |
| 6,471,185 B2 | 10/2002 | Lewin et al. |
| 6,475,931 B2 | 11/2002 | Bower et al. |
| 6,486,589 B1 | 11/2002 | Dujari et al. |
| 6,492,762 B1 | 12/2002 | Pant et al. |
| 6,495,945 B2 | 12/2002 | Yamaguchi et al. |
| 6,499,509 B2 | 12/2002 | Berger et al. |
| 6,502,803 B1 | 1/2003 | Mattes |
| 6,504,286 B1 | 1/2003 | Porat et al. |
| 6,509,802 B2 | 1/2003 | Kasperkovitz |
| 6,514,237 B1 | 2/2003 | Maseda |
| 6,522,516 B2 | 2/2003 | Anthony |
| 6,523,560 B1 | 2/2003 | Williams et al. |
| 6,528,925 B1 | 3/2003 | Takeuchi et al. |
| 6,528,928 B1 | 3/2003 | Burns et al. |
| 6,530,266 B1 | 3/2003 | Adderton et al. |
| 6,532,145 B1 | 3/2003 | Carlen et al. |
| 6,540,893 B1 | 4/2003 | Wakida et al. |
| 6,543,110 B1 | 4/2003 | Pelrine et al. |
| 6,545,384 B1 | 4/2003 | Pelrine et al. |
| 6,562,513 B1 | 5/2003 | Takeuchi et al. |
| 6,583,533 B2 | 6/2003 | Pelrine et al. |
| 6,586,859 B2 | 7/2003 | Kornbluh et al. |
| 6,590,267 B1 | 7/2003 | Goodwin-Johansson et al. |
| 6,593,155 B2 | 7/2003 | Mohler et al. |
| 6,613,816 B2 | 9/2003 | Mahdi et al. |
| 6,617,759 B1 | 9/2003 | Zumeris et al. |
| 6,617,765 B1 | 9/2003 | Lagier et al. |
| 6,619,799 B1 | 9/2003 | Blum et al. |
| 6,628,040 B2 | 9/2003 | Pelrine et al. |
| 6,631,068 B1 | 10/2003 | Lobo |
| 6,637,276 B2 | 10/2003 | Adderton et al. |
| 6,640,402 B1 | 11/2003 | Vooren et al. |
| 6,644,027 B1 | 11/2003 | Kelly |
| 6,646,077 B1 | 11/2003 | Lyons |
| 6,650,455 B2 | 11/2003 | Miles |
| 6,652,938 B1 | 11/2003 | Nishikawa et al. |
| 6,654,004 B2 | 11/2003 | Hoggarth |
| 6,664,718 B2 | 12/2003 | Pelrine et al. |
| 6,668,109 B2 | 12/2003 | Nahum et al. |
| 6,673,533 B1 | 1/2004 | Wohlstadter et al. |
| 6,680,825 B1 | 1/2004 | Murphy et al. |
| 6,682,500 B2 | 1/2004 | Soltanpour et al. |
| 6,690,101 B2 | 2/2004 | Magnussen et al. |
| 6,700,314 B2 | 3/2004 | Cuhat et al. |
| 6,701,296 B1 | 3/2004 | Kramer et al. |
| 6,707,236 B2 | 3/2004 | Pelrine et al. |
| 6,720,710 B1 | 4/2004 | Wenzel et al. |
| 6,733,130 B2 | 5/2004 | Blum et al. |
| 6,743,273 B2 | 6/2004 | Chung et al. |
| 6,762,050 B2 | 7/2004 | Fukushima et al. |
| 6,768,246 B2 | 7/2004 | Pelrine et al. |
| 6,781,284 B1 | 8/2004 | Pelrine et al. |
| 6,784,227 B2 | 8/2004 | Simon et al. |
| 6,791,205 B2 | 9/2004 | Woodbridge |
| 6,796,639 B2 | 9/2004 | Sugahara |
| 6,800,155 B2 | 10/2004 | Senecal et al. |
| 6,804,068 B2 | 10/2004 | Sasaki et al. |
| 6,806,621 B2 | 10/2004 | Heim et al. |
| 6,806,806 B2 | 10/2004 | Anthony |
| 6,806,808 B1 | 10/2004 | Watters et al. |
| 6,809,462 B2 | 10/2004 | Pelrine et al. |
| 6,809,928 B2 | 10/2004 | Gwin et al. |
| 6,812,624 B1 | 11/2004 | Pei et al. |
| 6,824,689 B2 | 11/2004 | Wang et al. |
| 6,847,153 B1 | 1/2005 | Balizer |
| 6,847,155 B2 | 1/2005 | Schwartz et al. |
| 6,856,305 B2 | 2/2005 | Nagano |
| 6,864,592 B1 | 3/2005 | Kelly |
| 6,866,242 B2 | 3/2005 | Hirota |
| 6,867,533 B1 | 3/2005 | Su et al. |
| 6,869,275 B2 | 3/2005 | Dante et al. |
| 6,876,125 B2 | 4/2005 | Basheer et al. |
| 6,876,135 B2 | 4/2005 | Pelrine et al. |
| 6,879,318 B1 | 4/2005 | Chan et al. |
| 6,882,086 B2 | 4/2005 | Kornbluh et al. |
| 6,891,317 B2 | 5/2005 | Pei et al. |
| 6,902,048 B1 | 6/2005 | Chung |
| 6,911,764 B2 | 6/2005 | Pelrine et al. |
| 6,935,287 B2 | 8/2005 | Shinogle |
| 6,938,945 B2 | 9/2005 | Wald et al. |
| 6,940,211 B2 | 9/2005 | Pelrine et al. |
| 6,940,212 B2 | 9/2005 | Mueller |
| 6,940,221 B2 | 9/2005 | Matsukiyo et al. |
| 6,944,931 B2 | 9/2005 | Shcheglov et al. |
| 6,952,313 B2 | 10/2005 | Schrader |
| 6,967,430 B2 | 11/2005 | Johansson |
| 6,994,314 B2 | 2/2006 | Garnier et al. |
| 6,997,870 B2 | 2/2006 | Couvillon, Jr. |
| 7,008,838 B1 | 3/2006 | Hosking et al. |
| 7,011,378 B2 | 3/2006 | Maluf et al. |
| 7,011,760 B2 | 3/2006 | Wang et al. |
| 7,029,056 B2 | 4/2006 | Browne et al. |

(56) References Cited

U.S. PATENT DOCUMENTS

| | | |
|---|---|---|
| 7,034,432 B1 | 4/2006 | Pelrine et al. |
| 7,037,270 B2 | 5/2006 | Seward |
| 7,038,357 B2 | 5/2006 | Goldenberg et al. |
| 7,049,732 B2 | 5/2006 | Pei et al. |
| 7,052,594 B2 | 5/2006 | Pelrine et al. |
| 7,062,055 B2 | 6/2006 | Pelrine et al. |
| 7,063,268 B2 | 6/2006 | Chrysler et al. |
| 7,063,377 B2 | 6/2006 | Brei et al. |
| 7,064,472 B2 | 6/2006 | Pelrine et al. |
| 7,071,596 B2 | 7/2006 | Krill |
| 7,075,162 B2 | 7/2006 | Unger |
| 7,075,213 B2 | 7/2006 | Krill |
| 7,092,238 B2 | 8/2006 | Saito et al. |
| 7,099,141 B1 | 8/2006 | Kaufman et al. |
| 7,104,146 B2 | 9/2006 | Benslimane et al. |
| 7,109,643 B2 | 9/2006 | Hirai et al. |
| 7,113,318 B2 | 9/2006 | Onuki et al. |
| 7,113,848 B2 | 9/2006 | Hanson |
| 7,115,092 B2 | 10/2006 | Park et al. |
| 7,140,180 B2 | 11/2006 | Gerber et al. |
| 7,141,888 B2 | 11/2006 | Sabol et al. |
| 7,142,368 B2 | 11/2006 | Kim et al. |
| 7,142,369 B2 | 11/2006 | Wu et al. |
| 7,144,616 B1 | 12/2006 | Unger et al. |
| 7,148,789 B2 | 12/2006 | Sadler et al. |
| 7,164,212 B2 | 1/2007 | Leijon et al. |
| 7,166,952 B2 | 1/2007 | Topliss et al. |
| 7,166,953 B2 | 1/2007 | Heim et al. |
| 7,170,665 B2 | 1/2007 | Kaneko et al. |
| 7,190,016 B2 | 3/2007 | Cahalen et al. |
| 7,193,350 B1 | 3/2007 | Blackburn et al. |
| 7,195,393 B2 | 3/2007 | Potter |
| 7,195,950 B2 | 3/2007 | Taussig |
| 7,196,688 B2 | 3/2007 | Schena |
| 7,199,302 B2 | 4/2007 | Raisanen |
| 7,199,501 B2 | 4/2007 | Pei et al. |
| 7,205,704 B2 | 4/2007 | Audren et al. |
| 7,205,978 B2 | 4/2007 | Poupyrev et al. |
| 7,209,280 B2 | 4/2007 | Goossens |
| 7,211,937 B2 | 5/2007 | Kornbluh et al. |
| 7,220,785 B2 | 5/2007 | Saito |
| 7,224,106 B2 | 5/2007 | Pei et al. |
| 7,233,097 B2 | 6/2007 | Rosenthal et al. |
| 7,235,152 B2 | 6/2007 | Bell et al. |
| 7,237,524 B2 | 7/2007 | Pelrine et al. |
| 7,242,106 B2 | 7/2007 | Kelly |
| 7,242,141 B2 | 7/2007 | Pschenitzka et al. |
| 7,245,440 B2 | 7/2007 | Peseux |
| 7,256,943 B1 | 8/2007 | Kobrin et al. |
| 7,259,495 B2 | 8/2007 | Asai et al. |
| 7,259,503 B2 | 8/2007 | Pei et al. |
| 7,276,090 B2 | 10/2007 | Shahinpoor et al. |
| 7,291,512 B2 | 11/2007 | Unger |
| 7,298,054 B2 | 11/2007 | Hirsch |
| 7,298,559 B2 | 11/2007 | Kato et al. |
| 7,298,603 B2 | 11/2007 | Mizuno et al. |
| 7,301,261 B2 | 11/2007 | Ifuku et al. |
| 7,310,874 B2 | 12/2007 | Higuchi et al. |
| 7,312,917 B2 | 12/2007 | Jacob |
| 7,320,457 B2 | 1/2008 | Heim et al. |
| 7,321,185 B2 | 1/2008 | Schultz |
| 7,323,790 B2 | 1/2008 | Taylor et al. |
| 7,332,688 B2 | 2/2008 | Browne et al. |
| 7,339,285 B2 | 3/2008 | Negron Crespo |
| 7,339,572 B2 | 3/2008 | Schena |
| 7,342,573 B2 | 3/2008 | Ryynanen |
| 7,355,293 B2 | 4/2008 | Bernhoff et al. |
| 7,359,124 B1 | 4/2008 | Fang et al. |
| 7,362,031 B2 | 4/2008 | Maita et al. |
| 7,362,032 B2 | 4/2008 | Pelrine et al. |
| 7,362,889 B2 | 4/2008 | Dubowsky et al. |
| 7,368,862 B2 | 5/2008 | Pelrine et al. |
| 7,371,596 B2 | 5/2008 | Warner, Jr. et al. |
| 7,373,454 B1 | 5/2008 | Noe |
| 7,378,783 B2 | 5/2008 | Pelrine et al. |
| 7,392,876 B2 | 7/2008 | Browne et al. |
| 7,394,182 B2 | 7/2008 | Pelrine et al. |
| 7,394,282 B2 | 7/2008 | Sinha et al. |
| 7,394,641 B2 | 7/2008 | Won et al. |
| 7,397,166 B1 | 7/2008 | Morgan et al. |
| 7,401,846 B2 | 7/2008 | Browne et al. |
| 7,411,332 B2 | 8/2008 | Kornbluh et al. |
| 7,426,340 B2 | 9/2008 | Seo |
| 7,429,074 B2 | 9/2008 | McKnight et al. |
| 7,429,495 B2 | 9/2008 | Wan |
| 7,436,099 B2 | 10/2008 | Pei et al. |
| 7,436,646 B2 | 10/2008 | Delince et al. |
| 7,442,421 B2 | 10/2008 | Li et al. |
| 7,442,760 B2 | 10/2008 | Roberts et al. |
| 7,444,072 B2 | 10/2008 | Seo |
| 7,446,926 B2 | 11/2008 | Sampsell |
| 7,449,821 B2 | 11/2008 | Dausch |
| 7,454,820 B2 | 11/2008 | Nakamura |
| 7,456,549 B2 | 11/2008 | Heim et al. |
| 7,468,575 B2 | 12/2008 | Pelrine et al. |
| 7,481,120 B2 | 1/2009 | Gravesen et al. |
| 7,492,076 B2 | 2/2009 | Heim et al. |
| 7,498,729 B2 | 3/2009 | Ogino |
| 7,499,223 B2 | 3/2009 | Berge et al. |
| 7,511,706 B2 | 3/2009 | Schena |
| 7,513,624 B2 | 4/2009 | Yavid et al. |
| 7,515,350 B2 | 4/2009 | Berge et al. |
| 7,518,284 B2 | 4/2009 | Benslimane et al. |
| 7,521,840 B2 | 4/2009 | Heim |
| 7,521,847 B2 | 4/2009 | Heim |
| 7,537,197 B2 | 5/2009 | Heim et al. |
| 7,548,015 B2 | 6/2009 | Benslimane et al. |
| 7,548,232 B2 | 6/2009 | Shahoian et al. |
| 7,567,681 B2 | 7/2009 | Pelrine et al. |
| 7,573,064 B2 | 8/2009 | Benslimane et al. |
| 7,585,122 B2 | 9/2009 | Eromaki et al. |
| 7,586,242 B2 | 9/2009 | Yokoyama et al. |
| 7,595,580 B2 | 9/2009 | Heim |
| 7,608,989 B2 | 10/2009 | Heydt et al. |
| 7,626,319 B2 | 12/2009 | Heim |
| 7,646,544 B2 | 1/2010 | Batchko et al. |
| 7,648,118 B2 | 1/2010 | Ukpai et al. |
| 7,659,918 B2 | 2/2010 | Turner |
| 7,679,267 B2 | 3/2010 | Heim |
| 7,679,839 B2 | 3/2010 | Polyakov et al. |
| 7,690,622 B2 | 4/2010 | Ito et al. |
| 7,702,227 B2 | 4/2010 | Ito et al. |
| 7,703,740 B1 | 4/2010 | Franklin |
| 7,703,742 B2 | 4/2010 | Heim et al. |
| 7,703,839 B2 | 4/2010 | McKnight et al. |
| 7,705,521 B2 | 4/2010 | Pelrine et al. |
| 7,714,701 B2 | 5/2010 | Altan et al. |
| 7,732,999 B2 | 6/2010 | Clausen et al. |
| 7,733,575 B2 | 6/2010 | Heim et al. |
| 7,745,374 B2 | 6/2010 | Tanaka et al. |
| 7,750,532 B2 | 7/2010 | Heim |
| 7,750,617 B2 | 7/2010 | Omi |
| 7,761,981 B2 | 7/2010 | Rosenthal et al. |
| 7,772,745 B2 | 8/2010 | Kawakubo et al. |
| 7,785,656 B2 | 8/2010 | Pei et al. |
| 7,787,646 B2 | 8/2010 | Pelrine et al. |
| 7,813,047 B2 | 10/2010 | Wang et al. |
| 7,824,580 B2 | 11/2010 | Boll et al. |
| 7,886,993 B2 | 2/2011 | Bachmaier et al. |
| 7,893,965 B2 | 2/2011 | Heim et al. |
| 7,898,159 B2 | 3/2011 | Heydt et al. |
| 7,911,115 B2 | 3/2011 | Pelrine et al. |
| 7,911,761 B2 | 3/2011 | Biggs et al. |
| 7,915,789 B2 | 3/2011 | Smith |
| 7,915,790 B2 | 3/2011 | Heim et al. |
| 7,921,541 B2 | 4/2011 | Pei et al. |
| 7,923,064 B2 | 4/2011 | Pelrine et al. |
| 7,923,902 B2 | 4/2011 | Heim |
| 7,923,982 B2 | 4/2011 | Sumita |
| 7,940,476 B2 | 5/2011 | Polyakov et al. |
| 7,952,261 B2 | 5/2011 | Lipton et al. |
| 7,958,789 B2 | 6/2011 | Hayakawa et al. |
| 7,971,850 B2 | 7/2011 | Heim et al. |
| 7,980,671 B2 | 7/2011 | Nystrom et al. |

(56) References Cited

U.S. PATENT DOCUMENTS

| | | |
|---|---|---|
| 7,986,466 B2 | 7/2011 | Lee et al. |
| 7,990,022 B2 | 8/2011 | Heim |
| 7,997,260 B2 | 8/2011 | Kaakkola et al. |
| 8,004,339 B2 | 8/2011 | Barrow |
| 8,007,986 B2 | 8/2011 | Zhang et al. |
| 8,026,023 B2 | 9/2011 | Hamada |
| 8,033,324 B2 | 10/2011 | Mukasa et al. |
| 8,042,264 B2 | 10/2011 | Rosenthal et al. |
| 8,049,333 B2 | 11/2011 | Alden et al. |
| 8,050,601 B2 | 11/2011 | Lin et al. |
| 8,054,566 B2 | 11/2011 | Heim et al. |
| 8,058,861 B2 | 11/2011 | Pelrine et al. |
| 8,072,121 B2 | 12/2011 | Heim et al. |
| 8,074,939 B2 | 12/2011 | Hyde et al. |
| 8,093,783 B2 | 1/2012 | Rosenthal et al. |
| 8,127,437 B2 | 3/2012 | Lipton et al. |
| 8,133,932 B2 | 3/2012 | Kijlstra et al. |
| 8,164,835 B2 | 4/2012 | Heim et al. |
| 8,172,998 B2 | 5/2012 | Bennett et al. |
| 8,183,739 B2 | 5/2012 | Heim |
| 8,211,054 B2 | 7/2012 | Dewey |
| 8,221,944 B2 | 7/2012 | Shirasaki et al. |
| 8,222,799 B2 | 7/2012 | Polyakov et al. |
| 8,237,324 B2 | 8/2012 | Pei et al. |
| 8,248,750 B2 | 8/2012 | Biggs et al. |
| 8,258,238 B2 | 9/2012 | Boersma et al. |
| 8,283,839 B2 | 10/2012 | Heim |
| 8,294,600 B2 | 10/2012 | Peterson et al. |
| 8,310,444 B2 | 11/2012 | Peterson et al. |
| 8,316,526 B2 | 11/2012 | Pei et al. |
| 8,319,403 B2 | 11/2012 | Lipton et al. |
| 8,419,822 B2 | 4/2013 | Li |
| 8,421,316 B2 | 4/2013 | Tryson et al. |
| 8,508,109 B2 | 8/2013 | Pelrine et al. |
| 8,545,987 B2 | 10/2013 | Strader et al. |
| 8,585,007 B2 | 11/2013 | Schapeler et al. |
| 8,594,839 B2 | 11/2013 | Hanson |
| 8,679,575 B2 | 3/2014 | Biggs et al. |
| 8,679,621 B2 | 3/2014 | Blaiszik et al. |
| 8,773,373 B2 | 7/2014 | Sato et al. |
| 8,779,650 B2 | 7/2014 | Jenninger et al. |
| 8,842,355 B2 | 9/2014 | Lipton et al. |
| 8,975,888 B2 | 3/2015 | Pelrine et al. |
| 8,981,621 B2 | 3/2015 | Pelrine et al. |
| RE45,464 E | 4/2015 | Kornbluh et al. |
| 9,195,058 B2 | 11/2015 | Zarrabi et al. |
| 2001/0007449 A1 | 7/2001 | Kobachi et al. |
| 2002/0083858 A1 | 7/2002 | MacDiarmid et al. |
| 2004/0014860 A1 | 1/2004 | Meier et al. |
| 2004/0046739 A1 | 3/2004 | Gettemy |
| 2004/0124738 A1 | 7/2004 | Pelrine et al. |
| 2004/0201122 A1* | 10/2004 | O'Brien ............ H01M 4/881 264/104 |
| 2005/0002113 A1 | 1/2005 | Berge |
| 2005/0046312 A1 | 3/2005 | Miyoshi |
| 2005/0085693 A1 | 4/2005 | Belson et al. |
| 2005/0113892 A1 | 5/2005 | Sproul |
| 2005/0140922 A1 | 6/2005 | Bekerman et al. |
| 2005/0200984 A1 | 9/2005 | Browne et al. |
| 2006/0045991 A1* | 3/2006 | Kokeguchi ............ C09K 19/52 428/1.1 |
| 2006/0057377 A1 | 3/2006 | Harrison et al. |
| 2006/0079619 A1 | 4/2006 | Wang et al. |
| 2006/0091796 A1* | 5/2006 | Shirogane ........ H01L 27/3239 313/506 |
| 2006/0108416 A1 | 5/2006 | Hirai |
| 2006/0122954 A1 | 6/2006 | Podlasek et al. |
| 2006/0138371 A1 | 6/2006 | Garnier |
| 2006/0163725 A1 | 7/2006 | Haba et al. |
| 2006/0197741 A1 | 9/2006 | Biggadike |
| 2006/0238069 A1 | 10/2006 | Maruyama et al. |
| 2006/0258912 A1 | 11/2006 | Belson et al. |
| 2007/0080435 A1 | 4/2007 | Lin |
| 2007/0122132 A1 | 5/2007 | Misawa et al. |
| 2007/0152982 A1 | 7/2007 | Kim et al. |
| 2007/0170910 A1 | 7/2007 | Chang et al. |
| 2007/0173602 A1 | 7/2007 | Brinkman et al. |
| 2007/0189667 A1 | 8/2007 | Wakita et al. |
| 2007/0200457 A1 | 8/2007 | Heim et al. |
| 2007/0219285 A1 | 9/2007 | Kropp et al. |
| 2007/0230222 A1 | 10/2007 | Drabing et al. |
| 2008/0043318 A1* | 2/2008 | Whitesides ....... G02F 1/133516 359/296 |
| 2008/0062589 A1 | 3/2008 | Drabing |
| 2008/0143696 A1 | 6/2008 | Goulthorpe |
| 2008/0152921 A1 | 6/2008 | Kropp |
| 2008/0191832 A1 | 8/2008 | Tsai |
| 2008/0303782 A1 | 12/2008 | Grant et al. |
| 2009/0028491 A1 | 1/2009 | Fillion et al. |
| 2009/0104448 A1 | 4/2009 | Thompson et al. |
| 2009/0184606 A1 | 7/2009 | Rosenthal et al. |
| 2009/0250021 A1 | 10/2009 | Zarrabi et al. |
| 2009/0297829 A1 | 12/2009 | Pyles et al. |
| 2010/0006827 A1 | 1/2010 | Buckley |
| 2010/0236843 A1 | 9/2010 | Englund |
| 2010/0265031 A1 | 10/2010 | Yen |
| 2011/0021917 A1 | 1/2011 | Morita |
| 2011/0128239 A1 | 6/2011 | Polyakov et al. |
| 2011/0155307 A1 | 6/2011 | Pelrine et al. |
| 2011/0256383 A1 | 10/2011 | Cochet et al. |
| 2011/0285247 A1 | 11/2011 | Lipton et al. |
| 2012/0126959 A1 | 5/2012 | Zarrabi et al. |
| 2012/0128960 A1 | 5/2012 | Büsgen |
| 2014/0014715 A1 | 1/2014 | Moran et al. |
| 2014/0176753 A1 | 6/2014 | Hillis et al. |
| 2014/0319971 A1 | 10/2014 | Yoo et al. |
| 2014/0322522 A1 | 10/2014 | Yoo |
| 2014/0352879 A1 | 12/2014 | Yoo et al. |
| 2015/0009009 A1 | 1/2015 | Zarrabi et al. |
| 2015/0034237 A1 | 2/2015 | Biggs et al. |
| 2015/0043095 A1 | 2/2015 | Lipton et al. |
| 2015/0084483 A1 | 3/2015 | Yoo et al. |
| 2015/0096666 A1 | 4/2015 | Yoo et al. |
| 2015/0221851 A1 | 8/2015 | Biggs et al. |
| 2015/0221852 A1 | 8/2015 | Biggs et al. |
| 2015/0221861 A1 | 8/2015 | Biggs et al. |
| 2015/0231802 A1 | 8/2015 | Quan et al. |
| 2015/0270791 A1 | 9/2015 | Sutherland et al. |
| 2015/0295175 A1 | 10/2015 | Hitchcock et al. |
| 2015/0319514 A1 | 11/2015 | Hitchcock et al. |
| 2016/0025429 A1 | 1/2016 | Muir et al. |
| 2016/0185085 A1* | 6/2016 | Spigaroli ............ B32B 27/32 426/87 |

FOREIGN PATENT DOCUMENTS

| | | |
|---|---|---|
| CA | 2769441 A1 | 2/2011 |
| CN | 1447365 A | 10/2003 |
| DE | 2535833 A1 | 2/1977 |
| DE | 4408618 A1 | 9/1995 |
| DE | 19636909 C1 | 3/1998 |
| DE | 19952062 A1 | 5/2000 |
| DE | 10058096 A1 | 6/2002 |
| DE | 10161349 A1 | 7/2003 |
| DE | 10335019 A1 | 2/2005 |
| EP | 0196839 A2 | 10/1986 |
| EP | 0295907 A1 | 12/1988 |
| EP | 0522882 A2 | 1/1993 |
| EP | 0833182 A2 | 4/1998 |
| EP | 0980103 A2 | 2/2000 |
| EP | 1050955 A1 | 11/2000 |
| EP | 1090835 A1 | 4/2001 |
| EP | 1323925 A2 | 7/2004 |
| EP | 1528609 A2 | 5/2005 |
| EP | 1698876 A2 | 9/2006 |
| EP | 1843406 A1 | 10/2007 |
| EP | 1976036 A2 | 10/2008 |
| EP | 2119747 B1 | 11/2009 |
| EP | 2511314 A1 | 10/2012 |
| FR | 2208461 A5 | 6/1974 |
| FR | 2745476 A1 | 9/1997 |
| GB | 2338513 A | 12/1999 |
| GB | 2470006 A | 11/2010 |
| JP | S 5181120 A | 7/1976 |

(56) References Cited

FOREIGN PATENT DOCUMENTS

| | | |
|---|---|---|
| JP | S 52120840 A | 10/1977 |
| JP | S 5445593 A | 4/1979 |
| JP | S 5542474 A | 3/1980 |
| JP | S 5565569 A | 5/1980 |
| JP | S 5661679 A | 5/1981 |
| JP | S 56101788 A | 8/1981 |
| JP | S 59126689 A | 7/1984 |
| JP | S 6199499 A | 5/1986 |
| JP | S 61239799 A | 10/1986 |
| JP | S 6397100 A | 4/1988 |
| JP | H 02162214 A | 6/1990 |
| JP | 02222019 A | 9/1990 |
| JP | 03173022 A | 7/1991 |
| JP | H 05244782 A | 9/1993 |
| JP | H 07111785 A | 4/1995 |
| JP | H 07240544 A | 9/1995 |
| JP | H 09275688 A | 10/1997 |
| JP | H 10137655 A | 5/1998 |
| JP | H 10207616 A | 8/1998 |
| JP | H 10321482 A | 12/1998 |
| JP | H 112764 A | 1/1999 |
| JP | 11134109 A | 5/1999 |
| JP | H 11133210 A | 5/1999 |
| JP | 2000-081504 A | 3/2000 |
| JP | 2000-331874 A | 11/2000 |
| JP | 2001-130774 A | 5/2001 |
| JP | 2001-136598 A | 5/2001 |
| JP | 2001-286162 A | 10/2001 |
| JP | 2001-291906 A | 10/2001 |
| JP | 2003-040041 A | 2/2003 |
| JP | 3501216 B2 | 3/2004 |
| JP | 2004-205827 A | 7/2004 |
| JP | 2004-221742 A | 8/2004 |
| JP | 2004-296154 A | 10/2004 |
| JP | 2004-353279 A | 12/2004 |
| JP | 2005-001885 A | 1/2005 |
| JP | 2005-202707 A | 7/2005 |
| JP | 3709723 B2 | 8/2005 |
| JP | 2005-260236 A | 9/2005 |
| JP | 2006-048302 A | 2/2006 |
| JP | 2006-509052 A | 3/2006 |
| JP | 2006-178434 A | 7/2006 |
| JP | 2006-244490 A | 9/2006 |
| JP | 2007-206362 A | 8/2007 |
| JP | 2007-287670 A | 11/2007 |
| JP | 2008-262955 A | 10/2008 |
| JP | 2008-277729 A | 11/2008 |
| JP | 2009-077618 A | 4/2009 |
| JP | 2009-249313 A | 10/2009 |
| JP | 2010-273524 A | 12/2010 |
| JP | 5415442 B2 | 2/2014 |
| KR | 2004-0097921 A | 12/2004 |
| KR | 10-0607839 B1 | 8/2006 |
| KR | 10-0650190 B1 | 11/2006 |
| KR | 2008-0100757 A | 11/2008 |
| KR | 2010-0121801 A | 11/2010 |
| KR | 20110122244 A | 11/2011 |
| TW | 11269615 B | 12/2006 |
| TW | I272194 B | 2/2007 |
| WO | WO 87/07218 A1 | 12/1987 |
| WO | WO 89/02658 A1 | 3/1989 |
| WO | WO 94/18433 A1 | 8/1994 |
| WO | WO 95/08905 A1 | 3/1995 |
| WO | WO 96/26364 A2 | 8/1996 |
| WO | WO 97/15876 A1 | 5/1997 |
| WO | WO 98/19208 A2 | 5/1998 |
| WO | WO 98/35529 A2 | 8/1998 |
| WO | WO 98/45677 A2 | 10/1998 |
| WO | WO 99/17929 A1 | 4/1999 |
| WO | WO 99/23749 A1 | 5/1999 |
| WO | WO 99/37921 A1 | 7/1999 |
| WO | WO 01/01025 A2 | 1/2001 |
| WO | WO 01/06575 A1 | 1/2001 |
| WO | WO 01/06579 A2 | 1/2001 |
| WO | WO 01/58973 A2 | 8/2001 |
| WO | WO 01/59852 A2 | 8/2001 |
| WO | WO 01/91100 A1 | 11/2001 |
| WO | WO 02/37660 A1 | 5/2002 |
| WO | WO 02/37892 A2 | 5/2002 |
| WO | WO 02/071505 A1 | 9/2002 |
| WO | WO 03/056274 A1 | 7/2003 |
| WO | WO 03/056287 A1 | 7/2003 |
| WO | WO 03/081762 A1 | 10/2003 |
| WO | WO 03/107523 A1 | 12/2003 |
| WO | WO 2004/009363 A1 | 1/2004 |
| WO | WO 2004/027970 A1 | 4/2004 |
| WO | WO 2004/053782 A1 | 6/2004 |
| WO | WO 2004/074797 A1 | 9/2004 |
| WO | WO 2004/079832 A2 | 9/2004 |
| WO | WO 2004/086289 A2 | 10/2004 |
| WO | WO 2004/093763 A1 | 11/2004 |
| WO | WO 2005/027161 A2 | 3/2005 |
| WO | WO 2005/053002 A2 | 6/2005 |
| WO | WO 2005/079187 A2 | 9/2005 |
| WO | WO 2005/079353 A2 | 9/2005 |
| WO | WO 2005/081676 A2 | 9/2005 |
| WO | WO 2005/086249 A1 | 9/2005 |
| WO | WO 2006/040532 A1 | 4/2006 |
| WO | WO 2006/102273 A2 | 9/2006 |
| WO | WO 2006/121818 A2 | 11/2006 |
| WO | WO 2006/123317 A2 | 11/2006 |
| WO | WO 2007/018877 A2 | 2/2007 |
| WO | WO 2007/029275 A1 | 3/2007 |
| WO | WO 2007/072411 A1 | 6/2007 |
| WO | WO 2008/039658 A2 | 4/2008 |
| WO | WO 2008/052559 A2 | 5/2008 |
| WO | WO 2008/105861 A2 | 9/2008 |
| WO | WO 2008/150817 A1 | 12/2008 |
| WO | WO 2009/006318 A1 | 1/2009 |
| WO | WO 2009/056497 A1 | 5/2009 |
| WO | WO 2009/076477 A1 | 6/2009 |
| WO | WO 2009/112988 A1 | 9/2009 |
| WO | WO 2010/054014 A1 | 5/2010 |
| WO | WO 2010/104953 A1 | 9/2010 |
| WO | WO 2010/115549 A1 | 10/2010 |
| WO | WO 2011/097020 | 8/2011 |
| WO | WO 2011/118315 A1 | 9/2011 |
| WO | WO 2012/032437 A1 | 3/2012 |
| WO | WO 2012/044419 A1 | 4/2012 |
| WO | WO 2012/099854 A1 | 7/2012 |
| WO | WO 2012/129357 A2 | 9/2012 |
| WO | WO 2012/148644 A2 | 11/2012 |
| WO | WO 2013/044195 A2 | 3/2013 |
| WO | WO 2013/055733 A1 | 4/2013 |
| WO | WO 2013/103470 A1 | 7/2013 |
| WO | WO 2013/142552 A1 | 9/2013 |
| WO | WO 2013/155377 A1 | 10/2013 |
| WO | WO 2013/192143 A1 | 12/2013 |
| WO | WO 2014/028819 A1 | 2/2014 |
| WO | WO 2014/028822 A1 | 2/2014 |
| WO | WO 2014/028825 A1 | 2/2014 |
| WO | WO 2014/062776 A1 | 4/2014 |
| WO | WO 2014/066576 A1 | 5/2014 |
| WO | WO 2014/074554 A2 | 5/2014 |
| WO | WO 2014/089388 A2 | 6/2014 |
| WO | WO 2014/187976 A1 | 11/2014 |
| WO | WO 2015/020698 A2 | 2/2015 |
| WO | WO 2015/051291 A1 | 4/2015 |
| WO | WO 2015/126928 A1 | 8/2015 |
| WO | WO 2015/126928 A4 | 12/2015 |

OTHER PUBLICATIONS

U.S. Appl. No. 14/771,371, filed Aug. 28, 2015.
U.S. Appl. No. 14/892,762, filed Nov. 20, 2015.
Ajluni, Cheryl, "Pressure Sensors Strive to Stay on Top, New Silicon Micromachining Techniques and Designs Promise Higher Performance," Electronic Design—Advanced Technology Series, Oct. 3, 1994, pp. 67-74.
Akle, Barbar J., et al., "Ionic Electroactive Hybrid Transducers," Smart Structures and Materials 2005: Electroactive Polymer Actuators and Devices (EAPAD), Proceedings of SPIE, Bellingham, WA, vol. 5759, 2005, pp. 153-164.

(56) References Cited

OTHER PUBLICATIONS

Anderson, R.A., "Mechanical Stress in a Delectric Solid From a Uniform Electric Field," The American Physical Society, 1986, pp. 1302-1307.

Aramaki, S., S. Kaneko, K. Arai, Y. Takahashi, H. Adachi, and K. Yanagisawa. 1995. "Tube Type Micro Manipulator Using Shape Memory Alloy (SMA)," Proceedings of the IEEE Sixth International Symposium on Micro Machine and Human Science, Nagoya, Japan, pp. 115-120.

Ashley, S., "Artificial Muscles", Scientific American 2003, pp. 53-59.

Ashley, S., "Smart Skis and Other Adaptive Structures," Mechanical Engineering, Nov. 1995, pp. 77-81.

Bar-Cohen, Yoseph, JPL, WorldWide ElectroActive Polymers, EAP (Artifical Muscles) Newsletter, vol. 1, No. 1, Jun. 1999.

Bar-Cohen, Yoseph, JPL, WorldWide ElectroActive Polymers, EAP (Artifical Muscles) Newsletter, vol. 1, No. 2, Dec. 1999.

Bar-Cohen, Yoseph, JPL, WorldWide ElectroActive Polymers, EAP (Artifical Muscles) Newsletter, vol. 2, No. 1, Jul. 2000.

Bar-Cohen, Yoseph, JPL, WorldWide ElectroActive Polymers, EAP (Artifical Muscles) Newsletter, vol. 2, No. 2, Dec. 2000.

Bar-Cohen, Yoseph, JPL, WorldWide ElectroActive Polymers, EAP (Artifical Muscles) Newsletter, vol. 3, No. 1, Jun. 2001.

Bar-Cohen, Yoseph, JPL, WorldWide ElectroActive Polymer Actuators Webhub webpages 1-7, http://ndeaa.jpl.nasa.gov/nasa-nde/lommas/eap/EAP-web.htm, downloaded Jul. 23, 2001 (7 pages).

Baughman, R., L. Shacklette, R. Elsenbaumer, E. Plichta, and C. Becht "Conducting Polymer Electromechanical Actuators," Conjugated Polymeric Materials: Opportunities in Electronics, Optoelectronics and Molecular Electronics, eds. J.L. Bredas and R.R. Chance, Kluwer Academic Publishers, The Netherlands, pp. 559-582, 1990.

Baughman, R.H., L.W. Shacklette, R.L. Elsenbaumer, E.J. Plichta, and C. Becht "Micro electromechanical actuators based on conducting polymers," in Molecular Electronics, Materials and Methods, P.I. Lazarev (ed.), Kluwer Academic Publishers, pp. 267-289 (1991).

Beckett, J., "New Robotics Tap the Mind, Help the Heart, SRI shows of latest technologies," San Francisco Chronicle, Aug. 27, 1998.

Begley, M. et al., "The Electro-Mechanical Response to Highly Compliant Substrates and Thin Stiff Films with Periodic Cracks," International Journal of Solids and Structures, 42:5259-5273, 2005.

Benslimane, M and P. Gravesen, "Mechanical Properties of Dielectric Elastomer Actuators with Smart Metallic Compliant Electrodes," Proceedings of SPIE, International Society for Optical Engineering, vol. 4695, Jan. 1, 2002, pp. 150-157.

Bharti, V., Y. Ye, T.-B. Xu and Q.M. Zhang, "Correlation Between Large Electrostrictive Strain and Relaxor Behavior with Structural Changes Induced in P(VDF-TrFE) Copolymer by Electron Irradiation," Mat. Res. Soc. Symp. Proc. vol. 541, pp. 653-659 (1999).

Bharti, V., Z.-Y.Cheng S. Gross, T.-B. Xu and Q.M. Zhang, "High Electrostrictive Strain Under High Mechanical Stress in Electron-Irradiated Poly(vinylidene fluoride-trifluoroethylene) Copolymer," Applied Physics Letters, vol. 75, No. 17, pp. 2653-2655 (Oct. 25, 1999).

Bharti, V., H.S. Xu, G. Shanthi and Q.M. Zhang, "Polarization and Structural Properties of High Energy Electron Irradiated Poly(vinylidene fluoride-trifluoroethylene) Copolymer Films," to be published in J. Appl. Phys. (2000).

Bharti, V.,X.-Z. Zhao, Q.M. Zhang, T. Romotowski, F. Tito, and R. Ting, "Ultrahigh Field Induced Strain and Polarization Response in Electron Irradiated Poly(Vinylidene Fluoride-Trifluoroethylene) Copolymer,"Mat. Res. Innovat. vol. 2, pp. 57-63 (1998).

Biomimetic Products, Inc., hhtp://www.biomimetic.com, Jun. 6, 2001.

Bobbio, S., M. Kellam, B. Dudley, S. Goodwin Johansson, S. Jones, J. Jacobson, F. Tranjan, and T. DuBois, "Integrated Force Arrays," in Proc. IEEE Micro Electro Mechanical Systems Workshop, Fort Lauderdale, Florida, Feb. 7-10, 1993, pp. 146-154.

Bohon, K. and S. Krause, "An Electrorheological Fluid and Siloxane Gel Based Electromechanical Actuator: Working Toward an Artificial Muscle," to be published in J. Polymer Sci., Part B. Polymer Phys. (2000).

Boyle, W. et al., "Departure from Paschen's Law of Breakdown in Gases," The Physical Review, Second Series, 97(2): 255-259, Jan. 15, 1955.

Brock, D.L., "Review of Artifical Muscle based on Contractile Polymers," MIT Artificial Intelligence Laboratory, A.I. Memo No. 1330, Nov. 1991.

Caldwell, D., G. Medrano-Cerda, and M. Goodwin, "Characteristics and Adaptive Control of Pneumatic Muscle Actuators for a Robotic Elbow," Proc. IEEE Int. Conference on Robotics and Automation, San Diego, California (May 8-13, 1994).

Calvert, P. and Z. Liu, "Electrically Stimulated Bilayer Hydrogels as Muscles," Proceedings of the SPIE International Symposium on Smart Structures and Materials: Electro-Active Plymer Actuators and Devices, Mar. 1-2, 1999, Newport Beach, California, USA, pp. 236-241.

Campolo, D., et al., "Efficient Charge Recovery Method for Driving Piezoelectric Actuators with Quasi-Square Waves," IEEE Transaction on Ultrasonics, Ferroelectrics and Frequency Control, IEE, US, vol. 50, No. 3, Mar. 1, 2003, pp. 237-244.

Chen et al., "Active control of low-frequency sound radiation from vibrating panel using planar sound sources," Journal of Vibration and Acoustics, vol. 124, pp. 2-9, Jan. 2002.

Chen, Zheng et al., "Quasi-Static Positioning of Ionic Polymer-Metal Composite (IPMC) Actuators," Proceedings of the 2005 IEEE/ASME International Conference on Advanced Intelligent Mechatronics, Monterey, California, Jul. 24-28, 2005, pp. 60-65.

Cheng, Z.-Y., H.S. Xu, J. Su, Q. M, Zhjang, P.-C. Wang and A.G. MacDiarmid, "High Performance of All-Polymer Electrostrictive Systems," Proceedings of the SPIE Ineternational Symposium on Smart Structures and Materials: Electro-Active Polymer Actuators and Devices, Mar. 1-2, 1999, Newport Beach, California, USA, pp. 140-148.

Cheng, Z.-Y., T.-B. Xu, V. Bharti, S. Wang, and Q.M. Zhang, "Transverse Strain Responses in the Electrostrictive Poly(Vinylidene Fluoride-Trifluorethylene) Copolymer," Appl. Phs. Lett. vol. 74, No. 13, pp. 1901-1903, Mar. 29, 1999.

Chiarelli, P., A. Della Santa, D. DeRossi, and A. Mazzoldi, "Actuation Properties of Electrochemically Driven Polypyrrole Free-Standing Films," Journal of Intelligent Material Systems and Structures, vol. 6, pp. 32-37, Jan. 1995.

Delille, R. et al., "Novel Compliant Electrodes Based on Platinum Salt Reduction," Smart Structures and Materials 2006: Electroactive Polymer Actuators and Devices (EAPAD), edited by Yoseph Bar-Cohen, Proceedings of SPIE, 6168 (6168Q), 2006.

De Rossi, D., and P. Chiarelli, "Biomimetic Macromolecular Actuators," Macro-Ion Characterization, American Chemical Society Symposium Series, vol. 548, Ch. 40, pp. 517-530 (1994).

Dowling, K., Beyond Faraday-NonTraditional Actuation, available on the World Wide Web at http://www.frc.ri.cmu.edu/~nivek/OTH/beyond-faraday/beyondfaraday.html, 9 pages, 1994.

Egawa, S. and T. Higuchi, "Multi-Layered Electrostatic Film Actuator," Proc. IEEE Micro Electra Mechanical Systems, Napa Valley, California, pp. 166-171 (Feb. 11-14, 1990).

Elhami, K. B. Gauthier-Manuel, "Electrostriction of the Copolymer of Vinylidene-Fluoride and Trifluoroethylene," J. Appl. Phys. vol. 77 (8), 3987-3990, Apr. 15, 1995.

Flynn, Anita M., L.S. Tavrow, S.F. Bart, R.A. Brooks, D.J. Ehrlich, Kr.R. Udayakumar, and L.E. Cross. 1992. "Piezoelectric Micromotors for Microrobots," IEEE Journal of Microelectromechanical Systems, vol. 1, No. 1, pp. 44-51 (Mar. 1992); also published as MIT Al Laboratory Memo 1269, Massachusetts Institute of Technology (Feb. 1991).

Ford, V. and J. Kievet, "Technical Support Package on Traveling-Wave Rotary Actuators", NASA Tech Brief, vol. 21, No. 10, Item #145, from JPL New Technology Report NPO-19261, Oct. 1997.

Full, R.J. and K. Meijer, "Artificial Muscles Versus Natural Actuators from Frogs to Flies," Proceedings of the 7th SPIE Symposium

(56) References Cited

OTHER PUBLICATIONS on Smart Structures and Materials-Electroactive Polymers and Devices (EAPAD) Conference, Mar. 6-8, 2000, Newport Beach, California, USA, pp. 2-9.
Furuhata, T., T. Hirano, and H. Fujita, "Array-Driven Ultrasonic Microactuators," Solid State Sensors and Actuators, 1991, Digest of Tech. Papers, Transducers, pp. 1056-1059.
Furukawa, T. and N. Seo, "Electrostriction as the Origin of Piezoelectricity in Ferroelectric Polymers," Japanese J. Applied Physics, vol. 29, No. 4, pp. 675-680 (Apr. 1990).
Gardner, J.W., "Microsensors: Principles and Applications," John Wiley, 1994. (Book—not attached).
Ghaffarian, S.R., et al., "Electrode Structures in High Strain Actuator Technology," Journal of Optoelectronics and Advanced Materials, Nov. 2007, 9(11), pp. 3585-3591.
Gilbertson, R.G. and J.D. Busch. "Survey of MicroActuator Technologies for Future Spacecraft Missions," presented a the conference entitled "Practical Robotic Interstellar Flight: Are We Ready?" New York University and the United Nations, New York. (Aug. 29 and Sep. 1, 1994); also published on the World Wide Web at http://nonothinc.com/nanosci/microtech/mems/ten-actuators/gilbertson.html.
Goldberg, Lee, "Adaptive-Filtering Developments Extend Noise-Cancellation Applications," Electronic Design, Feb. 6, 1995, pp. 34 and 36.
Greene, M. J.A. Willett, and R. Kornbluh, "Robotic Systems," in ONR Report 32198-2, Ocean Engineering and Marine Systems 1997 Program (Dec. 1997).
Greenland, P. Allegro Microsystems Inc., and B. Carsten, Bruce Carsten Associates, "Stacked Flyback Converters Allow Lower Voltage MOSFETs for High AC Line Voltage Operation," Feature PCIM Article, PCIM, Mar. 2000.
Hansen, G., "High Aspect Ratio Sub-Micron and Nano-Scale Metal Filaments," Sampe Journal, 41(2): 24-33, 2005.
Heydt, R., R. Pelrine, J. Joseph, J. Eckerle, and R. Kornbluh, "Acoustical Performance of an Electrostrictive Polymer Film Loudspeaker," Journal of the Acoustical Society of America, vol. 107(2), pp. 833-839 (Feb. 2000).
Heydt, R., R. Kornbluh, R. Pelrine, and B. Mason, "Design and Performance of an Electrostrictive Polymer Film Acoustic Actuator," Journal of Sound and Vibration (1998) 215(2), 297-311.
Hirano, M., K. Yanagisawa, H. Kuwano, and S. Nakano, "Microvalve with Ultra-Low Leakage," Tenth Annual International Workshop on Micro Electromechanical Systems, Nagoya, Japan, IEEE Proceedings (Jan. 26-30, 1997), pp. 323-326.
Hirose, S., Biologically Inspired Robots: Snake-like Locomotors and Manipulators, "Development of the Acm as a Manipulator," Oxford University Press, New York, 1993, pp. 170-172.
http://www.neurosupplies.com/pdf_files/transducers.pdf, printed from web Jul. 25, 2001.
Huang, Cheng et al., "Colossal Dielectric and Electromechanical Responses in Self-Assembled Polymeric Nanocomposites", Applied Physics Letters 87, 182901 (2005), pp. 182901-1 through 182901-3.
Hunter, I.W. and S. Lafontaine, "A Comparison of Muscle with Artificial Actuators," Technical Digest of the IEEE Solid-State Sensor and Actuator Workshop, Hilton Head, South Carolina, Jun. 22-25, 1992, pp. 178-185.
Hunter, I., S. Lafontaine, J. Hollerbach, and P. Hunter, "Fast Reversible NiTi Fibers for Use in MicroRobotics," Proc. 1991 IEEE Micro Electro Mechanical Systems—MEMS '91, Nara, Japan, pp. 166-170.
Jacobsen, S., R. Price, J. Wood, T. Rytting and M. Rafaelof, "A Design Overview of an Eccentric-Motion Electrostatic Microactuator (the Wobble Motor)", Sensors and Actuators, 20 (1989) pp. 1-16.
Joseph, J., R. Pelrine, J. Eckerle, J. Bashkin, and P. Mulgaonkar, "Micro Electrochemical Composite Sensor", SRI International, printed from web Jul. 25, 2001.

Kaneto, K., M. Kaneko, Y. Min, and A.G. MacDiarmid, "Artifical Muscle: Electromechanical Actuators Using Polyaniline Films," Synthetic Metals 71, pp. 2211-2212, 1995.
Kawamura, S., K. Minani, and M. Esashi, "Fundamental Research of Distributed Electrostatic Micro Actuator," Technical Digest of the 11th Sensor Symposium, pp. 27-30 (1992).
Khuri-Yakub et al., "Silicon micromachined ultrasonic transducers," Japan Journal of Applied Physics, vol. 39 (2000), pp. 2883-2887, par 1, No. 5B, May 2000.
Kinsler et al., Fundamentals of Acoustics, Third Edition, John Wiley and Sons, 1982.
Kondoh, Y., and T. Ono. 1991. "Bimorph Type Actuators using Lead Zinc Niobate-based Ceramics," Japanese Journal of Applied Physics, vol. 30, No. 9B, pp. 2260-2263, Sep. 1991.
Kornbluh, R., R. Pelrine, R. Heydt, and Q. Pei, "Acoustic Actuators Based on the Field-Activated Deformation of Dielectric Elastomers," (2000).
Kornbluh, R., G. Andeen, and J. Eckerle, "Artificial Muscle: the Next Generation of Robotic Actuators," presented at the Fourth World Conference on Robotics Research, SME Paper M591-331, Pittsburgh, PA, Sep. 17-19, 1991.
Kornbluh, R., "Description of Children's Tour," Aug. 20, 2000.
Kornbluh, R. D and R. E. Pelrine., "Dexterous Multiarticulated Manipulator with Electrostrictive Polymer Artificial Muscle," ITAD-7247-QR-96-175, SRI Project No. 7247, Prepared for Office of Naval Research, Nov. 1996.
Kornbluh, R., R. Pelrine, J. Joseph, "Elastomeric Dielectric Artificial Muscle Actuators for Small Robots," Proceedings of the Third Iasted International Conference on Robotics and Manufacturing, Jun. 14-16, 1995, Cancun, Mexico.
Kornbluh, R., R. Pelrine, Q. Pei, and V. Shastri "Electroactive Polymer (EAP) Actuators as Artificial Muscles—Reality, Potential and Challenges", Chapter 16, Application of Dielectric EAP Actuators, SPIE Press, May 2001.
Kornbluh, R. et al., "Electroactive polymers: An emerging technology for MEMS," (invited) in MEMS/MOEMS Components and Their Applications, eds. S. Janson, W. Siegfried, and A. Henning, Proc. SPIE, 5344:13-27, 2004.
Kornbluh, R. et al., "Electroelastomners: Applications of dielectric elastomer transducers for actuation, generation and smart structures," Smart Structures and Materials 2002: Industrial and Commercial Applications of Smart Structures Technologies, ed., A. McGowan, Proc. SPIE, 4698:254-270, 2002.
Kornbluh, R., Pelrine, R., Eckerie, J., Joseph, J., "Electrostrictive Polymer Artificial Muscle Actuators," IEEE International Conference on Robotic and Automation, Leuven, Belgium, 1998.
Kornbluh, R., R. Pelrine, Jose Joseph, Richard Heydt, Qibing Pei, Seiki Chiba, 1999. "High-Field Electrostriction of Elastomeric Polymer Dielectrics for Actuation", Proceedings of the SPIE International Symposium on Smart Structures and Materials: Electro-Active Polymer Actuators and Devices, Mar. 1-2, 1999, Newport Beach, California, USA. pp. 149-161.
Kornbluh et al., "Medical Applications of New Electroactive Polymer Artificial Muscles," SRI International, Menlo Park, CA, JSPP, v. 16, 2004.
Kornbluh, Roy D., Robotic Systems, Ocean Engineering and Marine Systems, 2000 Program, Jan. 2001, Office of Naval Research Public Release, ONR-32100-1.
Kornbluh, Roy D., Robotic Systems, Ocean Engineering and Marine Systems, 1999 Program, Feb. 2000, Office of Naval Research Public Release, ONR-32100-2.
Kornbluh, Roy D., Robotic Systems, Ocean Engineering and Marine Systems, 1997 Program, Dec. 1997, Office of Naval Research Public Release, ONR-32198-2.
Kornbluh, Roy D., Robotic Systems, Ocean Engineering and Marine Systems, 1998 Program, Feb. 1999, Office of Naval Research Public Release, ONR-32199-4.
Kornbluh, R., "Presentation to Colin Corporation", Jan. 1997.
Kornbluh, R. Presentation to Medtronic, "Elastomeric Polymer Actuator and Transducers: The Principles, Performance and Applications of a New High-Strain Smart Material Technology", SRI International Medtronic Forum, Brooklyn Center, Minnesota, Jan. 2000.Jan. 2000.

(56) References Cited

OTHER PUBLICATIONS

Kornbluh, R. et al., "Shape control of large lightweight mirrors with dielectric elastomer actuation," Actuation Smart Structures and Materials 2003: Electroactive Polymer Actuators and Devices, ed. Y. Bar-Cohen, Proc. SPIE, 5051, 2003.

Kornbluh, R., Pelrine, R. Joseph, J., Pei, Q. and Chiba., "Ultra-High Strain Response of Elastomeric Polymer Dielectrics", Proc. Materials Res. Soc., Fall meeting, Boston, MA, pp. 1-12, Dec. 1999.

Kornbluh, R., R. Pelrine, Q. Pei, S. Oh, and J. Joseph, 2000. "Ultrahigh Strain Response of Field-Actuated Elastomeric Polymers," Proceedings of the 7th SPIE Symposium on Smart Structures and Materials-Electroactive Polymers and Devices (EAPAD) Conference, Mar. 6-8, 2000, Newport Beach, California, USA, pp. 51-64.

Kornbluh, R., "Use of Artificial Muscle Butterfly for Chronicle Newpaper Photograph," Aug. 1998.

Ktech's PVDF Sensors, http://www.ktech.com/pvdf.htm, Jun. 6, 2001, pp. 1-5.

Kymissis et al., "Parasitic Power Harvesting in Shoes," XP-010312825—Abstract, Physics and Media Group, MIT Media Laboratory E15-410, Cambridge, MA, Oct. 19, 1998, pp. 132-139.

Lacour, S. et al., "Mechanisms of Reversible Stretchability of Thin Metal Films on Elastomeric Substrates, "Applied Physics Letters 88, 204103, 2006.

Lacour, S. et al., "Stretchable Interconnects for Elastic Electronic Surfaces," Proceedings of the IEEE on Flexible Electronics Technology, 93(8): 1459-1467, 2005.

Lakes, R.S., "Extreme damping in compliant composites with a negative stiffness phase" or "Extreme Damping in Composite Materials with Negative Stiffness Inclusions", Nature, 410, 565-567, Mar. 2001.

Lakes, R.S., "Extreme damping in compliant composites with a negative stiffness phase", Philosophical Magazine Letters, 81, 95-100 (2001).

Lakes, R.S., "Extreme damping in compliant composites with a negative stiffness phase" or "Extreme Damping in Composite Materials with a Negative Stiffness Phase", Physical Review Letters, 86, 2897-2900, Mar. 26, 2001.

Lang, J, M. Schlect, and R. Howe, "Electric Micromotors: Electromechanical Characteristics," Proc. IEEE Micro Robots and Teleoperators Workshop, Hyannis, Massachusetts (Nov. 9-11, 1987).

Lawless, W. and R. Arenz, "Miniature Solid-state Gas Compressor," Rev. Sci Instrum., 58(8), pp. 1487-1493, Aug. 1987.

Liu, C., Y. Bar-Cohen, and S. Leary, "Electro-statically stricted polymers (ESSP)," Proceedings of the SPIE International Symposium on Smart Structures and Materials: Electro-Active Polymer Actuators and Devices, Mar. 1-2, 1999, Newport Beach, California, USA., pp. 186-190.

Liu, C. & Y. Bar-Cohen, "Scaling Laws of Microactuators and Potential Aplications of Elecroactive Polymers in MEMS", SPIE, Conference on Electroactive Polymer Actuators and Devices, Newport Beach, CA Mar. 1999.

Liu, Y., T. Zeng, Y.X. Wang, H. Yu, and R. Claus, "Self-Assembled Flexible Electrodes on Electroactive Polymer Actuators," Proceedings of the SPIE International Symposium on Smart Structures and Materials: Electro-Active Polymer Actuators and Devices, Mar. 1-2, 1999, Newport Beach, California, USA., pp. 284-288.

Madden et al., "Conducting polymer actuators as engineering materials," SPIE: Smart Materials and Structures, ed. Yoseph Bar-Cohen, Bellingham, WA, pp. 176-190, Pub 2002.

Madden, J.D. et al., "Fast contracting polypyrrole actuators", Jan. 6, 2000, Elsevier Science S.A., pp. 185-192.

Martin, J. and R. Anderson, 1999. "Electrostriction in Field-Structured Composites: Basit for a Fast Artificial Muscle?", The Journal of Chemical Physics, vol. 111, No. 9, pp. 4273-4280, Sep. 1, 1999.

Measurements Specialties, Inc.-Piezo Home, http://www.msiusa.com/piezo/index.htm, Jun. 6, 2001.

Möller, S. et al., A Polymer/semiconductor write-once read-many-times memory, Nature, vol. 26, Nov. 13, 2003, pp. 166-169, Nature Publishing Group.

Nguyen, T.B., C.K. DeBolt, S.V. Shastri and A. Mann, "Advanced Robotic Search," in ONR Ocean, Atmosphere, and Space Fiscal Year 1999 Annual Reports (Dec. 1999).

Nguyen, T., J. A. Willett and Kornbluh, R., "Robotic systems," in ONR Ocean, Atmosphere, and Space Fiscal Year 1998 Annual Reports (Dec. 1998).

Nguyen, T., Green, M., and Kornbluh, R., "Robotic Systems," in ONR Ocean, Atmosphere, and Space Fiscal Year 1999 Annual Reports (Dec. 1999).

Nguyen, T., Green, M., and Kornbluh, R., "Robotic Systems," in ONR Ocean, Atmosphere, and Space Fiscal Year 2000 Annual Reports (Jan. 2001). (Cited in U.S. Pat. No. 7,211,937 however, unable to locate).

Nihon Kohden Corporation, Operators Manual, available Oct. 1, 2001.

NXT plc, Huntingdon, UK (www.nxtsound.com) Sep. 17, 2008.

Ohara, K., M. Hennecke, and J. Fuhrmann, "Electrostriction of polymethylmethacrylates," Colloid & Polymer Sci. vol. 280, 164-168 (1982).

Olsson, A., G. Stemme, and E. Stemme, "The First Valve-less Diffuser Gas Pump," Tenth Annual International Workshop on Micro Electromechanical Systems, Nagoya, Japan, IEEE Proceedings (Jan. 26-30, 1997), pp. 108-113.

Olsson, A., O. Larsson, J. Holm, L. Lundbladh, O. Ohinan, and G. Stemme. 1997. "Valve-less Diffuser Micropumps Fabricated using Thermoplastic Replication," Proc. IEEE Micro Electro Mechanical Systems, Nagoya, Japan, pp. 305-310 (Jan. 26-30, 1997).

Osterbacka, R. et al., "Two-Dimensional Electronic Excitations in Self-Assembled Conjugated Polymer Nanocrystals," Science, vol. 287:839-842, Feb. 4, 2000.

Otero, T.F., J. Rodriguez, E. Angulo and C. Santamaria, "Artificial Muscles from Bilayer Structures," Synthetic Metals, vol. 55-57, pp. 3713-3717 (1993).

Otero, T.F., J. Rodriguez, and C. Santamaria, "Smart Muscle Under Electrochemical Control of Molecular Movement in Polypyrrole Films," Materials Research Society Symposium Proceedings, vol. 330, pp. 333-338, 1994.

Park, S.E., and T. Shrout., "Ultrahigh Strain and Piezoelectric Behavior in Relaxor Based Ferroelectric Single Crystals," J. Appl. Phys., vol. 82, No. 4, pp. 1804-1811, Aug. 15, 1997.

Pei, Q., O. Inganäs, and I. Lundström, "Bending Bilayer Strips Built From Polyaniline for Artificial Electrochemical Muscles," Smart Materials and Structures, vol. 2, pp. 1-6., Jan. 22, 1993.

Pei, Qibing "Description of Conference Demonstration" Mar. 2001.

Pei et al., "Electrochemical Applications of the Bending Beam Method. 1. Mass Transport and Volume Changes in Polypyrrole During Redox," J. Phys. Chem., 1992, 96, pp. 10507-10514.

Pei, Q. et al., "Multifunctional Electroelastomer Roll Actuators and Their Application for Biomimetic Walking Robots," Smart Structures and Materials 2003. Electroactive Polymer Actuators and Devices, San Diego, CA, USA, Mar. 2003, vol. 5051, 2003, pp. 281-290, XP002291729, Proceedings of the SPIE, ISSN: 0277-786X, the whole document.

Pei, Q. et al., "Multifunctional Electroelastomer Rolls," Mat. Res. Soc. Symp. Proc., vol. 698, Nov. 26-30, 2001, Boston, MA, pp. 165-170.

Pei, Q., Pelrine, R., Kornbluh, R., Jonasdottir, S., Shastri, V., Full, R., "Multifunctional Electroelastomers: Electroactive Polymers Combining Structural, Actuating, and Sensing Functions," ITAD-433-PA-00-123, University of California at Berkeley, Berkeley, CA, available at www.sri.com-publications, Jan. 17, 2001.

Pei, Q. et al., "Recent Progress on Electroelastomer Artificial Muscles and Their Application for Biomimetic Robots", SPIE, Pub. Jun. 2004, 11 pages.

Pelrine, R. et al., "Applications of dielectric elastomer actuators," (invited paper) in Smart Structures and Materials 2001: Electroactive Polymer Actuators and Devices, ed., Y. Bar Cohen, Proc. SPIE, 4329:335-349, 2001.

(56) References Cited

OTHER PUBLICATIONS

Pelrine, R. and Kornbluh, R., and. 1995. "Dexterous Multiarticulated Manipulator with Electrostrictive Polymer Artificial Muscle Actuator," EMU 95-023, SRI International, Menlo Park, California, Apr. 28, 1995.
Pelrine, R., R. Kornbluh, and J. Joseph, "Electrostriction of Polymer Dielectrics with Compliant Electrodes as a Means of Actuation," Sensors and Actuators A: Physical, vol. 64, No. 1, 1998, pp. 77-85.
Pelrine, R., R. Kornbluh, J. Joseph and S. Chiba, "Electrostriction of Polymer Films for Microactuators," Proc. IEEE Tenth Annual International Workshop on Micro Electro Mechanical Systems, Nagoya, Japan, Jan. 26-30, 1997, pp. 238-243.
Pelrine et al., "Electrostrictive Polymer Artificial Muscle Actuators," May 1998, Proc. of the 1998 IEEE Conf. on Robotics & Automation, pp. 2147-2154.
Pelrine, R., R. Kornbluh, and J. Joseph, FY 1992 Final Report on Artifical Muscle for Small Robots, ITAD-3393-FR-93-063, SRI International, Menlo Park, California, Mar. 1993.
Pelrine, R., R. Kornbluh, and J. Joseph, FY 1993 Final Report on Artifical Muscle for Small Robots, ITAD-4570-FR-94-076, SRI International, Menlo Park, California, 1994.
Pelrine, R., R. Kornbluh, and J. Joseph, FY 1994 Final Report on Artifical Muscle for Small Robots, ITAD-5782-FR-95-050, SRI International, Menlo Park, California, 1995.
Pelrine, R., R. Kornbluh, and J. Joseph, FY 1995 Final Report on Artifical Muscle for Small Robots, ITAD-7071-FR-96-047, SRI International, Menlo Park, California, 1996.
Pelrine, R., R. Kornbluh, and J. Joseph, FY 1996 Final Report on Artifical Muscle for Small Robots, ITAD-7228-FR-97-058, SRI International, Menlo Park, California, 1997.
Pelrine, R., R. Kornbluh, and J. Joseph, FY 1997 Final Report on Artifical Muscle for Small Robots, ITAD-1612-FR-98-041, SRI International, Menlo Park, California, 1998.
Pelrine, R., R. Kornbluh, and J. Joseph, FY 1998 Final Report on Artifical Muscle for Small Robots, ITAD-3482-FR-99-36, SRI International, Menlo Park, California, 1999.
Pelrine, R., R. Kornbluh, and J. Joseph, FY 1999 Final Report on Artifical Muscle for Small Robots, ITAD-10162-FR-00-27, SRI International, Menlo Park, California, 2000.
Pelrine, R., R. Kornbluh, Q. Pei, and J. Joseph, "High Speed Electrically Actuated Elastomers with Over 100% Strain," Science, vol. 287, No. 5454, pp. 1-21, 2000.
Pelrine, R., R. Kornbluh, Q. Pei, and J. Joseph. "High Speed Electrically Actuated Elastomers with Strain Greater Than 100%", Science, Reprint Series, Feb. 4, 2000, vol. 287, pp. 836-839.
Pelrine, R., R. Kornbluh, and G. Kofod, "High Strain Actuator Materials Based on Dielectric Elastomers," submitted to Advanced Materials (May 2000).
Pelrine, R., Roy Kornbluh, Jose Joseph, Qibing Pei, Seiki Chiba "Recent Progress in Artificial Muscle Micro Actuators," SRI Interational, Tokyo, 1999 MITI/NEEDOIMNIC, 1999.
Pelrine, R., R. Kornbluh, J. Joseph and S. Chiba, "Review of Artificial Muscle Approaches," invited paper, in Proc. Third International Symposium on Micro Machine and Human Science, Nagoya, Japan, Oct. 14-16, 1992.
Piezoflex(TM) PVDF Polymer Sensors, http://www.airmar.com/piezo/pvdf.htm. Jun. 6, 2001.
Polyoxymethylene urea NPL docyument, retrieved Nov. 11, 2015.
PowerLab ADInstruments, MLT001 High-Sensitivity Force Transducers, AD Instruments Transducers Series, printed from web Jul. 25, 2001.
Prahlad, H. et al., "Programmable Surface Deformation: Thickness-Mode Electroactive Polymer Actuators and their Applications," Proc. SPIE, vol. 5759, 102, 2005, 12 pages.
Puers et al, "A Capacitive Pressure Sensor with Low Impedance Output and Active Suppression of Parasitic Effects," Sensors and Actuators, A21-A23 (1990) 108-114.
Puers, Robert, "Capacitive sensors: when and how to use them," Sensors and Actuators A, 37-38 (1993) 93-105.
Reed, C. et al., "The Fundamentals of Aging HV Polymer-Film Capacitors," IEEE Transactions on Dielectrics and Electrical Insulation, 1(5): 904-922, 1994.
Sakarya, S., "Micromachining Techniques for Fabrication of Integrated Light Modulting Devices", Netherlands 2003, pp. 1-133.
Scheinbeim, J., B. Newman, Z. Ma, and J. Lee, "Electrostrictive Response of Elastomeric Polymers," ACS Polymer Preprints, 33(2), pp. 385-386, 1992.
Schlaberg, H. I., and J. S. Duffy, "Piezoelectric Polymer Composite Arrays for Ultrasonic Medical Imaging Applications," Sensors and Actuators, A 44, pp. 111-117, Feb. 22, 1994.
Seoul et al., "Electrospinning of Poly(vinylidene fluoride) Dimethylformamide Solutions with Carbon Nanotubes," Department of Textile Engineering, Inha University, Mar. 31, 2003.
Shahinpoor, M., "Micro-electro-mechanics of Ionic Polymer Gels as Electrically Controllable Artificial Muscles," J. Intelligent Material Systems and Structures, vol. 6, pp. 307-314, May 1995.
Shkel, Y. and D. Klingenberg, "Material Parameters for Electrostriction," J. Applied Physics, vol. 80(8), pp. 4566-4572, Oct. 15, 1996.
Smela, E., O. Inganas, and I. Lundstrom, "Controlled Folding of Micrometer-size Structures," Science, vol. 268, pp. 1735-1738 (Jun. 23, 1995).
Smela, E., O. Inganas, Q. Pei and I. Lundstrom, "Electrochemical Muscles: Micromachinging Fingers and Corkscrews," Advanced Materials, vol. 5, No. 9, pp. 630-632, Sep. 1993.
Smith, S. et al., A low switching voltage organic-on-inorganic heterojunction memory element utilizing a conductive polymer fuse on a doped silicon substrate, Applied Physics Letters, vol. 84, No. 24, May 28, 2004, pp. 5019-5021.
Sokolova, M. et al., "Influence of a Bias Voltage on the Characteristics of Surface Discharges in Dry Air," Plasma Processes and Polymers, 2: 162-169, 2005.
Sommer-Larsen, P. and A. Ladegaard Larsen, "Materials for Dielectric Elastomer Actuators," SPIE, vol. 5385, Mar. 1, 2004, pp. 68-77.
Standard Test Methods for Rubber Deterioration—Cracking in an Ozone Controlled Environment, ASTM International, D 1149-07.
Su, J., Q.M. Zhang, C.H. Kim, R.Y. Ting and R. Capps, "Effects of Transitional Phenomena on the Electric Field induced Strain-electrostrictive Response of a Segmented Polyurethane elastomer," pp. 1363-1370, Jan. 20, 1997.
Su, J, Z. Ounaies, J.S. Harrison, Y. Bara-Cohen and S. Leary, "Electromechanically Active Polymer Blends for Actuation," Proceedings of 7th SPIE Symposium on Smart Structures and Materials-Electroactive Polymers and Devices (EAPAD) Conference, Mar. 6-8, 2000, Newport Beach, CA, USA, pp. 65-72.
Suzuki et al., "Sound radiation from convex and concave domes in infinite baffle," Journal of the Acoustical Society of America, vol. 69(2), Jan. 1981.
Technology, http://www.micromuscle.com/html/technology.html, Jun. 6, 2001.
"The Rubbery Ruler", http://www.ph.unimelb.edu.au, printed from web Jul. 25, 2001.
Tobushi, H., S. Hayashi, and S. Kojima, "Mechanical Properties of Shape Memory Polymer of Polyurethane Series," in JSME International Journal, Series I, vol. 35, No. 3, 1992.
Todorov et al, "WWWeb Application for Ferropiezoelectric Ceramic Parameters Calculation", Proceedings 24th International Conference on Microelectronics, vol. 1, May 2004, pp. 507-510.
Treloar, L.R.G., "Mechanics of Rubber Elasticity," J Polymer Science, Polymer Symposium, No. 48, pp. 107-123, 1974.
Uchino, K. 1986. "Electrostrictive Actuators: Materials and Applicaions," Ceramic Bulletin, 65(4), pp. 647-652, 1986.
Unger et al. (2000), "Monolithic Microfabricated Valves and Pumps by Multilayer Soft Lithography," Science 288:113-116, no month.
Wade, Jr., W.L., R.J. Mannone and M. Binder, "Increased Dielectric Breakdown Strengths of Melt-Extruded Polyporphlene Films," Polymer vol. 34, No. 5, pp. 1093-1094 (1993).
Wax, S.G. and R.R. Sands, "Electroactive Polymer Actuators and Devices," Proceedings of the SPIE International Symposium on Smart Structures and Materials: Electro-Active Polymer Actuators and Devices, Mar. 1-2, 1999, Newport Beach, CA, USA, pp. 2-10.
Whitesides et al. (2001), "Flexible Methods for Microfluidics," Physics Today 52(6):42-47, no month.

(56) References Cited

OTHER PUBLICATIONS

Winters, J., "Muscle as an Actuator for Intelligent Robots," Robotics Research: Trans. Robotics International of SME, Scottsdale, AZ (Aug. 18-21, 1986).

Woodard, Improvements of ModalMax High-Fidelity Peizoelectric Audio Device (LAR-16321-1), NASA Tech Briefs, May 2005, p. 36.

Xia, Younan et al., "Triangular Nanoplates of Silver: Synthesis, Characterization, and Use as Sacrificial Templates for Generating Triangular Nanorings of Gold," Adv. Mater., 2003, 15, No. 9, pp. 695-699.

Yam, P., "Plastics Get Wired," Scientific American, vol. 273, pp. 82-87, Jul. 1995.

Yoshio, O., "Ablation Characteristics of Silicone Insulation," Journal of Polymer Science: Part A: Polymer Chemistry, 36: 233-239, 1998.

Yuan, W. et al. "New Electrode Materials for Dielectric Elastomer Actuators, " Proc. SPIE, 6524 (6524ON), 2007.

Zhang, Q.M., V. Bharti, Z.Y. Cheng, T.B. Xu, S. Wang, T.S. Ramotowski, F. Tito, and R. Ting, "Electromechanical Behavior of Electroactive P(VDF-TrFE) Copolymers," Proceedings of the SPIE International Symposium on Smart Structures and Materials: Electro-Active Polymer Actuators and Devices, Mar. 1-2, 1999, Newport Beach, CA, USA, pp. 134-139.

Zhang, Q., V. Bharti and X. Zhao, "Giant Electrostriction and Relaxor Ferroelectric Behavior in Electron-irradiated Poly(vinylidene fluoride-trifluoroethylene) Copolymer," Science, vol. 280, pp. 2101-2104 (Jun. 26, 1998).

Zhang, Q.M., Z.Y. Cheng, V. Bharti, T.B. Xu, H. Xu, T. Mai and S.J. Gross, "Piezoelectric and Electrostrictive Polymeric Actuator Materials," Proceedings of the 7th SPIE Symposium on Smart Structures and Materials: Electroactive Polymers and Devices (EAPAD) Conference, Mar. 6-8, 2000, Newport Beach, CA, USA, pp. 34-50.

Zhenyi, M., J.I. Scheinbeim, J.W. Lee, and B.A. Newman. 1994. "High Field Electrostrictive Response of Polymers," Journal of Polymer Sciences, Part B—Polymer Physics, vol. 32, pp. 2721-2731, 1994.

U.S. Appl. No. 15/131,579, filed Apr. 18, 2016.

\* cited by examiner

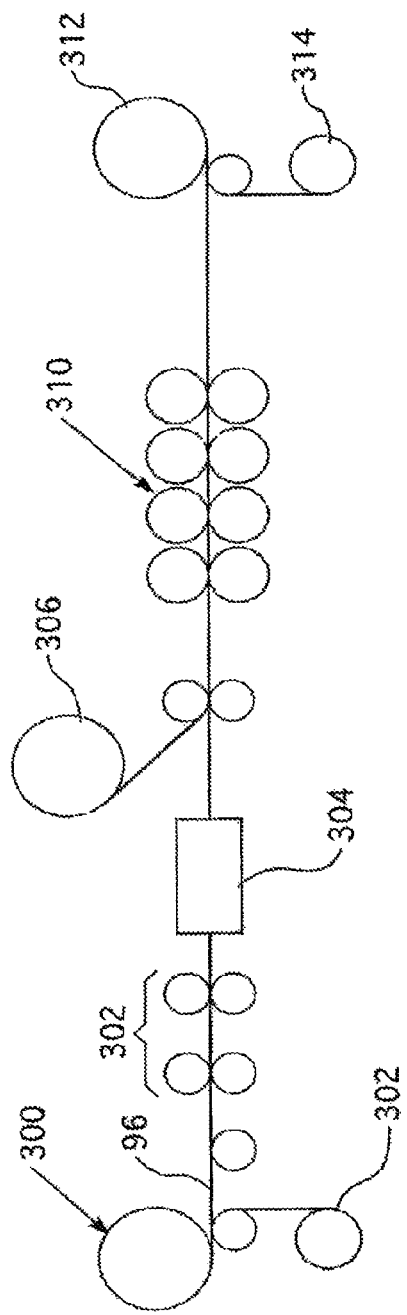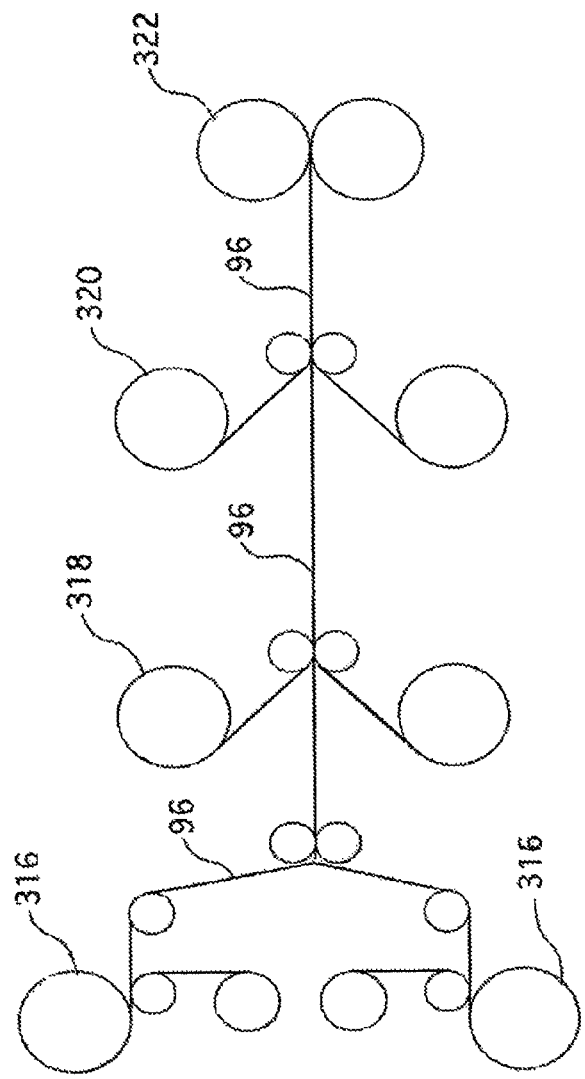
FIG. 3A
FIG. 3B

Modified Tooling Buss Bar

AUTOMATED MANUFACTURING PROCESSES FOR PRODUCING DEFORMABLE POLYMER DEVICES AND FILMS

RELATED APPLICATIONS

This application is a U.S. national stage application, filed under 35 U.S.C. §371, of PCT/US2012/027188, which was filed on Mar. 1, 2012 entitled "AUTOMATED MANUFACTURING PROCESSES FOR PRODUCING DEFORMABLE POLYMER DEVICES AND FILMS," and claims the benefit, under 35 USC §119(e), of U.S. Provisional Application No. 61/477,675 filed Apr. 21, 2011 entitled "AUTOMATED EPAM MANUFACTURING PROCESSES"; 61/477,709 filed Apr. 21, 2011 entitled "LINER-LESS PRINTING"; 61/482,751 filed May 5, 2011 entitled "LINER-LESS PRINTING II"; 61/447,832 filed Mar. 1, 2011 entitled, "FIBRILLATED STRUCTURE FOR ELECTRODE"; 61/546,683 filed Oct. 13, 2011 "MODIFIED SOFT TOOLING AND EFFECT OF TROUGHS IN PRINT THICKNESS"; 61/549,799 filed Oct. 21, 2011 entitled, "USE CONTINUOUS WEB FRAME BELT FOR ROLL-TO-ROLL CARTRIDGE PRINTING/PROCESS", and 61/556,408 filed Nov. 7, 2011 the entirety of each of which are incorporated by reference.

FIELD OF THE INVENTION

The present invention is directed in general to manufacturing and more specifically, to high volume manufacturing processes for producing electroactive polymer films and devices.

BACKGROUND OF THE INVENTION

A tremendous variety of devices used today rely on actuators of one sort or another to convert electrical energy to mechanical energy. Conversely, many power generation applications operate by converting mechanical action into electrical energy. Employed to harvest mechanical energy in this fashion, the same type of device may be referred to as a generator. Likewise, when the structure is employed to convert physical stimulus such as vibration or pressure into an electrical signal for measurement purposes, it may be characterized as a sensor. Yet, the term "transducer" may be used to generically refer to any of the devices.

A number of design considerations favor the selection and use of advanced dielectric elastomer materials, also referred to as "electroactive polymers", for the fabrication of transducers. These considerations include potential force, power density, power conversion/consumption, size, weight, cost, response time, duty cycle, service requirements, environmental impact, etc. As such, in many applications, electroactive polymer technology offers an ideal replacement for piezoelectric, shape-memory alloy and electromagnetic devices such as motors and solenoids.

An electroactive polymer transducer comprises two electrodes having deformable characteristics and separated by a thin elastomeric dielectric material. When a voltage difference is applied to the electrodes, the oppositely charged electrodes attract each other thereby compressing the polymer dielectric layer therebetween. As the electrodes are pulled closer together, the dielectric polymer film becomes thinner (the Z-axis component contracts) as it expands in the planar directions (along the X- and Y-axes), i.e., the displacement of the film is in-plane. The electroactive polymer film may also be configured to produce movement in a direction orthogonal to the film structure (along the Z-axis), i.e., the displacement of the film is out-of-plane. U.S. Pat. No. 7,567,681 discloses electroactive polymer film constructs which provide such out-of-plane displacement—also referred to as surface deformation or as thickness mode deflection.

The material and physical properties of the electroactive polymer film may be varied and controlled to customize the deformation undergone by the transducer. More specifically, factors such as the relative elasticity between the polymer film and the electrode material, the relative thickness between the polymer film and electrode material and/or the varying thickness of the polymer film and/or electrode material, the physical pattern of the polymer film and/or electrode material (to provide localized active and inactive areas), the tension or pre-strain placed on the electroactive polymer film as a whole, and the amount of voltage applied to or capacitance induced upon the film may be controlled and varied to customize the features of the film when in an active mode.

Numerous applications exist that benefit from the advantages provided by such electroactive polymer films whether using the film alone or using it in an electroactive polymer actuator. One of the many applications involves the use of electroactive polymer transducers as actuators to produce haptic feedback (the communication of information to a user through forces applied to the user's body) in user interface devices. There are many known user interface devices which employ haptic feedback, typically in response to a force initiated by the user. Examples of user interface devices that may employ haptic feedback include keyboards, keypads, game controller, remote control, touch screens, computer mice, trackballs, stylus sticks, joysticks, etc. The user interface surface can comprise any surface that a user manipulates, engages, and/or observes regarding feedback or information from the device. Examples of such interface surfaces include, but are not limited to, a key (e.g., keys on a keyboard), a game pad or buttons, a display screen, etc.

The haptic feedback provided by these types of interface devices is in the form of physical sensations, such as vibrations, pulses, spring forces, etc., which a user senses either directly (e.g., via touching of the screen), indirectly (e.g., via a vibrational effect such a when a cell phone vibrates in a purse or bag) or otherwise sensed (e.g., via an action of a moving body that creates a pressure disturbance sensed by the user). The proliferation of consumer electronic media devices such as smart phones, personal media players, portable computing devices, portable gaming systems, electronic readers, etc., can create a situation where a sub-segment of customers would benefit or desire an improved haptic effect in the electronic media device. However, increasing haptic capabilities in every model of an electronic media device may not be justified due to increased cost or increased profile of the device. Moreover, customers of certain electronic media devices may desire to temporarily improve the haptic capabilities of the electronic media device for certain activities.

Use of electroactive polymer materials in consumer electronic media devices as well as the numerous other commercial and consumer applications highlights the need to increase production volume while maintaining precision and consistency of the films.

SUMMARY OF THE INVENTION

Electroactive polymer devices that can be used with these designs include, but are not limited to planar, diaphragm, thickness mode, roll, and passive coupled devices (hybrids) as well as any type of electroactive polymer device described in the commonly assigned patents and applications cited herein.

In some variations, the electroactive polymer actuator comprises at least one electroactive polymer cartridge, where the electroactive polymer cartridge includes an electroactive polymer film comprising a dielectric elastomer layer, wherein a portion of the dielectric elastomer layer is between a first and a second electrodes wherein the overlapping portions of the electrodes define an active area comprising the active portion, whereupon application of a triggering signal to the electrodes causes movement of the active area to produce the haptic effect.

The electroactive polymer actuator can include a plurality of discrete electroactive polymer cartridges coupled together, where the electroactive polymer actuator includes an increased active portion comprising each active area of each electroactive polymer cartridge.

As noted above, there remains a need to mass produce such electroactive polymer devices while maintaining the performance characteristics obtained through batch production or lower volume manufacturing processes.

The present disclosure includes a process for high volume fabrication of a deformable polymeric film device. In one variation, the process comprises continuously advancing a film of an elastomeric material from a supply of elastomeric material, optionally mechanically straining the film to create a first pre-strained film section that remains continuous with the supply of elastomeric material, supporting the film section such that the first film section comprises a supported portion and an unsupported portion, depositing an ink to create at least a first electrode on a first side of the unsupported portion of the first film section, and depositing the ink to create at least a second electrode on a second side of the unsupported portion of the first film section opposing the first electrode and forming at least one opposing electrode pair to complete at least a first section of electroactive polymeric film and collecting the first section of electroactive polymeric film.

Optionally, the process can further include mechanically straining the film to create a second pre-strained film section that remains continuous with the film, supporting the second pre-strained film section such that the second pre-strained film section comprises a supported portion and an unsupported portion, depositing an ink to create at least a first electrode on a first side of the unsupported portion of the second pre-strained film section, printing at least a second electrode on a second side of the unsupported portion of the second pre-strained film section opposing the first electrode to form at least one opposing electrode pair to complete at least a second section of electroactive polymeric film and collecting the second section of electroactive polymeric film.

In some variations of the inventive process, the film section may be supported by increasing the rigidity of a portion of the film section.

The process can further include stacking or laminating at least the first and second sections to create a multi-layer film.

In some variations of the inventive manufacturing process, layers of structural or adhesive material can be applied to the electroactive polymer film either before or during the stacking or lamination process step.

The processes described herein may include advancing the film of an elastomeric material from the supply of elastomeric material by unwinding a supply roll of the elastomeric material. The film may be advanced at a constant rate or in a stepwise fashion where each section of the film stops at each of a series of process stations for a given dwell time.

In some variations of the manufacturing process, supporting the first pre-strained film section comprises applying a supporting layer to the first pre-strained film section and/or applying UV or thermal treatment the first pre-strained film section.

As part of the inventive manufacturing process, the film can optionally be reinforced with a tape or other material applied to the edges to prevent tearing or tear propagation. The tape or the applied material can be stretchable or patterned in such a way as to enable the film to stretch.

Applying pre-strain to the film can include the use of a first and second belt member on respective near and far edges of the film, where the first and second belt members each comprise a top surface and a bottom surface sandwiching the film, and where the belt member comprises a material having a Young's Modulus greater than a Young's Modulus of the film. Optionally, the belt members can comprise perforated belt members and where perforation rollers are used to mechanically strain the film.

One method of creating the perforated belts is to laminate or cast the polymer film onto a release liner that has fine perforated lines parallel to the web direction similar to the perforated lines along the edges of pin-fed printer paper. During the inventive transducer manufacturing process, the center region of the release liner can be separated from the unsupported regions of the film and from strips of release liner along the edges of the film by tearing along the perforated lines. The remaining strips of release liner serve as perforated belts and may have additional perforations defining holes which are punched out by pins or sprockets on the perforation rollers. Alternatively, these holes may be punched, drilled, or cut as part of the transducer manufacturing process.

The strain of the film may be bi-directional or uni-directional to produce an isotropic pre-strained film section or an anisotropic pre-strained film section.

The use of the tooling and processes described herein also allow for using a screen printing process where the first pre-strained film section is advanced against a process tooling as the ink is applied to the pre-strained film.

In certain variations, the inventive process may include the use of "soft tooling". For example, the printing process can further comprise positioning a removable liner between the first pre-strained film section and the process tooling to assist in release of the first pre-strained film section from the process tooling. Alternatively, or in combination, the printing process can include positioning an engineered surface and/or a compliant layer between the first pre-strained film section and the process tooling to assist in release of the first pre-strained film section from the process tooling. In yet another variation, the process can include positioning a deformable layer between the first pre-strained film section and a process tooling, where the deformable layer allows release of the first pre-strained film section without the use of a liner affixed to the first pre-strained film section. The deformable layer may comprise a foam layer.

Soft tooling permits varying pressures on the same surface of the film. For example, the processes described herein can further include a deformable layer that comprises at least one cavity in a surface of the deformable layer such that application of the deformable layer against the first pre-strained film section allows for a first pressure at the cavity and a second pressure at the surface to permit printing of varying ink depths on the first pre-strained film section.

The inventive manufacturing process may also include applying at least a frame and/or an output bar to the first section of electroactive polymer films to assemble an electroactive polymer actuator device. Alternatively, the process to collect the first section of electroactive polymer film comprises winding a plurality of electroactive polymer films to form a roll of electroactive polymer films.

Another variation of the process described below includes producing an electroactive polymer film for use in an electroactive polymer device. In one variation, the process includes pre-straining a section of elastomeric film to produce a pre-strained elastomeric film, supporting the pre-strained elastomeric film; positioning an intermediary layer between the pre-strained elastomeric film and a process tooling and screen printing at least one electrode on the pre-strained elastomeric film by depositing an ink to form the electrode on a first surface of the pre-strained elastomeric film, where the intermediary layer permits release of the second surface from the process tooling subsequent to the screen printing process.

The intermediary layer can include a removable liner. Alternatively, or in combination, the intermediary layer may include an engineered surface and/or a compliant layer, where the engineered surface comprises a surface selected from the group consisting of a parchment paper, a screen mesh, a textured surface, a non-stick surface and a polymer sheet.

In another variation, the intermediary layer comprises a deformable layer. For example, the deformable layer can comprise an ethylene vinyl acetate foam material. The deformable layer can comprise similarly soft materials such as silicones and polyurethane gels or foams with the appropriate surface release properties for the film. Use of a deformable layer also allows for a plurality of cavities in the deformable layer. The cavities permit regions of varying pressure during screen printing, the process further comprising depositing ink at varying levels on the first surface of the pre-strained elastomeric film.

Another variation disclosed herein the present invention includes an electroactive polymer film for use in an electroactive polymer device prepared by a process comprising the steps of pre-straining a section of elastomeric film, screen printing at least one electrode on a surface of the section of elastomeric film using a deformable layer between the elastomeric film and a process tooling, where the deformable layer comprises one or more cavities permitting varying pressures during deposition of ink to deposit ink sections having varying depths on the elastomeric film; and affixing one or more frames, output bars, or flexures to the film surface.

In addition to screen printing, other printing processes such as flexography, pad printing, gravure printing, ink jet printing, and aerosol jet printing may prove useful in the present manufacturing process.

These and other features, objects and advantages of the invention will become apparent to those persons skilled in the art upon reading the details of the invention as more fully described below. In addition, variations of the processes and devices described herein include combinations of the embodiments or of aspects of the embodiments where possible are within the scope of this disclosure even if those combinations are not explicitly shown or discussed.

BRIEF DESCRIPTION OF THE DRAWINGS

The invention is best understood from the following detailed description when read in conjunction with the accompanying drawings. To facilitate understanding, the same reference numerals have been used (where practical) to designate similar elements are common to the drawings. Included in the drawings are the following:

FIG. 3A illustrates a schematic roll-to-roll process for preparing an elastomeric film into an electroactive polymer film;

FIG. 3B illustrates two rolls of electroactive polymer films being combined to produce an electroactive polymer device;

Figure 1A:
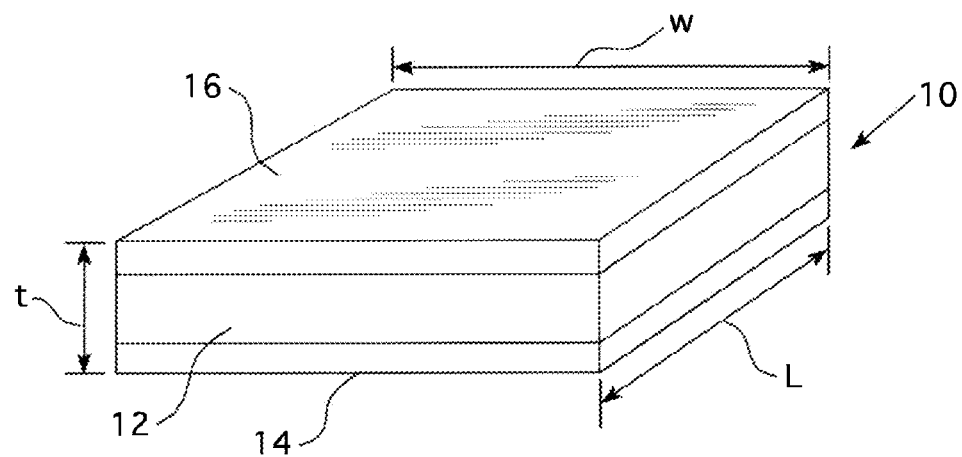
FIGS. 1A and 1B illustrate a top perspective view of a transducer before and after application of a voltage in accordance with one embodiment of the present invention.

Variation of the invention from that shown in the figures is contemplated.

DETAILED DESCRIPTION OF THE INVENTION

Examples of electroactive polymer devices and their applications are described, for example, in U.S. Pat. Nos. 7,394,282; 7,378,783; 7,368,862; 7,362,032; 7,320,457; 7,259,503; 7,233,097; 7,224,106; 7,211,937; 7,199,501; 7,166,953; 7,064,472; 7,062,055; 7,052,594; 7,049,732; 7,034,432; 6,940,221; 6,911,764; 6,891,317; 6,882,086; 6,876,135; 6,812,624; 6,809,462; 6,806,621; 6,781,284; 6,768,246; 6,707,236; 6,664,718; 6,628,040; 6,586,859; 6,583,533; 6,545,384; 6,543,110; 6,376,971; 6,343,129; 7,952,261; 7,911,761; 7,492,076; 7,761,981; 7,521,847; 7,608,989; 7,626,319; 7,915,789; 7,750,532; 7,436,099; 7,199,501; 7,521,840; 7,595,580; and 7,567,681, and in U.S. Patent Application Publication Nos. 2009/0154053; 2008/0116764; 2007/0230222; 2007/0200457; 2010/0109486; and 2011/128239, and PCT Publication No. WO2010/054014, the entireties of which are incorporated herein by reference.

The present invention provides a process for producing a patterned deformable polymer film for use in a deformable polymer device, the process including positioning an intermediary layer between a deformable film and a process tooling and printing at least one electrode on the deformable film by depositing an ink to form the at least one electrode on a first surface of the deformable film, wherein the intermediary layer permits release of the deformable film from the process tooling subsequent to the printing process.

Films useful in the present invention include, but are not limited to those made from polymers such as silicone, polyurethane, acrylate, hydrocarbon rubber, olefin copolymer, polyvinylidene fluoride copolymer, fluoroelastomer styrenic copolymer, and adhesive elastomer.

It is noted that the figures discussed herein schematically illustrate exemplary configurations of devices that employ electroactive polymer films or transducers having such electroactive polymer films. Many variations are within the scope of this disclosure, for example, in variations of the device, the electroactive polymer transducers can be implemented to move a mass to produce an inertial haptic sensation. Alternatively, the electroactive polymer transducer can produce movement in the electronic media device when coupled to the assembly described herein. Electroactive transducers manufactured with the processes disclosed here can be used as actuators, generators, or sensors in many other applications including, without limitation, fluid handling systems, motion control, adaptive optical devices, vibration control systems, and energy harvesting systems.

In any application, the displacement created by the electroactive polymer transducer can be exclusively in-plane which is sensed as lateral movement, or can be out-of-plane (which is sensed as vertical displacement). Alternatively, the electroactive polymer transducer material may be segmented to provide independently addressable/movable sections so as to provide angular displacement of the housing or electronic media device or combinations of other types of displacement. In addition, any number of electroactive polymer transducers or films (as disclosed in the applications and patent listed herein) can be incorporated in the user interface devices described herein.

The electroactive polymer transducer may be configured to displace to an applied voltage, which facilitates programming of a control system used with the subject tactile feedback devices. Electroactive polymer transducers are ideal for such applications for a number of reasons. For example, because of their light weight and minimal components, electroactive polymer transducers offer a very low profile and, as such, are ideal for use in sensory/haptic feedback applications.

Figure 1B:
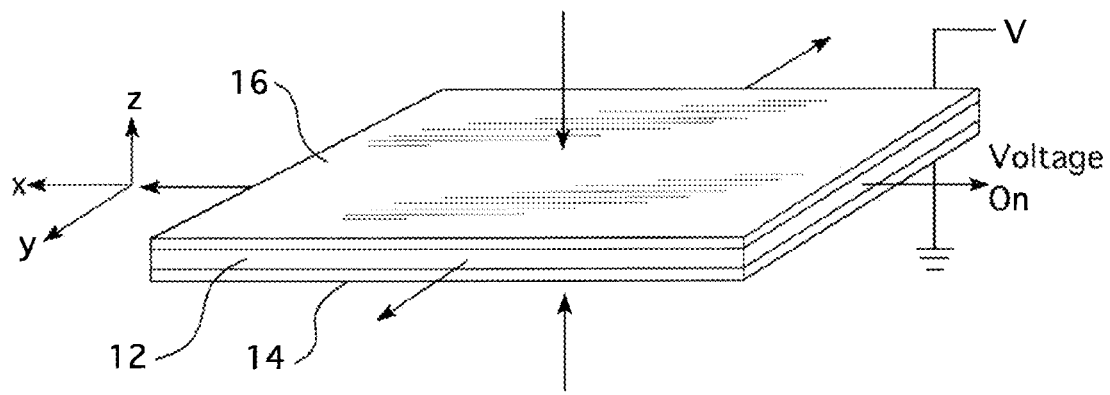

FIGS. 1A and 1B illustrate an example of an electroactive polymer film or membrane 10 structure. A thin elastomeric dielectric film or layer 12 is sandwiched between compliant or stretchable electrode plates or layers 14 and 16, thereby forming a capacitive structure or film. The length "l" and width "w" of the dielectric layer, as well as that of the composite structure, are much greater than its thickness "t". Preferably, the dielectric layer has a thickness in the range from about 10 μm to about 100 μm, with the total thickness of the structure in the range from about 15 μm to about 10 cm. Additionally, it is desirable to select the elastic modulus, thickness, and/or the geometry of electrodes 14, 16 such that the additional stiffness they contribute to the actuator is generally less than the stiffness of the dielectric layer 12, which has a relatively low modulus of elasticity, i.e., less than about 100 MPa and more preferably less than about 10 MPa, but is likely thicker than each of the electrodes. Electrodes suitable for use with these compliant capacitive structures are those capable of withstanding cyclic strains greater than about 1% without failure due to mechanical fatigue.

As seen in FIG. 1B, when a voltage is applied across the electrodes, the unlike charges in the two electrodes 14, 16 are attracted to each other and these electrostatic attractive forces compress the dielectric film 12 (along the Z-axis). The dielectric film 12 is thereby caused to deflect with a change in electric field. As electrodes 14, 16 are compliant, they change shape with dielectric layer 12. In the context of the present invention, "deflection" refers to any displacement, expansion, contraction, torsion, linear or area strain, or any other deformation of a portion of dielectric film 12. Depending on the architecture, e.g., a frame, in which capacitive structure 10 is employed (collectively referred to as a "transducer"), this deflection may be used to produce mechanical work. Various different transducer architectures are disclosed and described in the above-identified patent references.

With a voltage applied, the transducer film 10 continues to deflect until mechanical forces balance the electrostatic forces driving the deflection. The mechanical forces include elastic restoring forces of the dielectric layer 12, the compliance or stretching of the electrodes 14, 16 and any external resistance provided by a device and/or load coupled to transducer 10. The resultant deflection of the transducer 10 as a result of the applied voltage may also depend on a number of other factors such as the dielectric constant of the elastomeric material and its size and stiffness. Removal of the voltage difference and the induced charge causes the reverse effects.

In some cases, the electrodes 14 and 16 may cover a limited portion of dielectric film 12 relative to the total area of the film. This may be done to prevent electrical breakdown around the edge of the dielectric or achieve customized deflections in certain portions thereof. Dielectric material outside an active area (the latter being a portion of the dielectric material having sufficient electrostatic force to enable deflection of that portion) may be caused to act as an external spring force on the active area during deflection. More specifically, material outside the active area may resist or enhance active area deflection by its contraction or expansion.

The dielectric film 12 may be pre-strained. The pre-strain improves conversion between electrical and mechanical energy, i.e., the pre-strain allows the dielectric film 12 to deflect more and provide greater mechanical work. Pre-strain of a film may be described as the change in dimension in a direction after pre-straining relative to the dimension in that direction before pre-straining. The pre-strain may include elastic deformation of the dielectric film and be formed, for example, by stretching the film in tension and fixing one or more of the edges while stretched. The pre-strain may be imposed at the boundaries of the film or for only a portion of the film and may be implemented by using a rigid frame or by stiffening a portion of the film.

The transducer structure of FIGS. 1A and 1B and other similar compliant structures and the details of their constructs are more fully described in many of the referenced patents and publications disclosed herein.

Figure 2A:
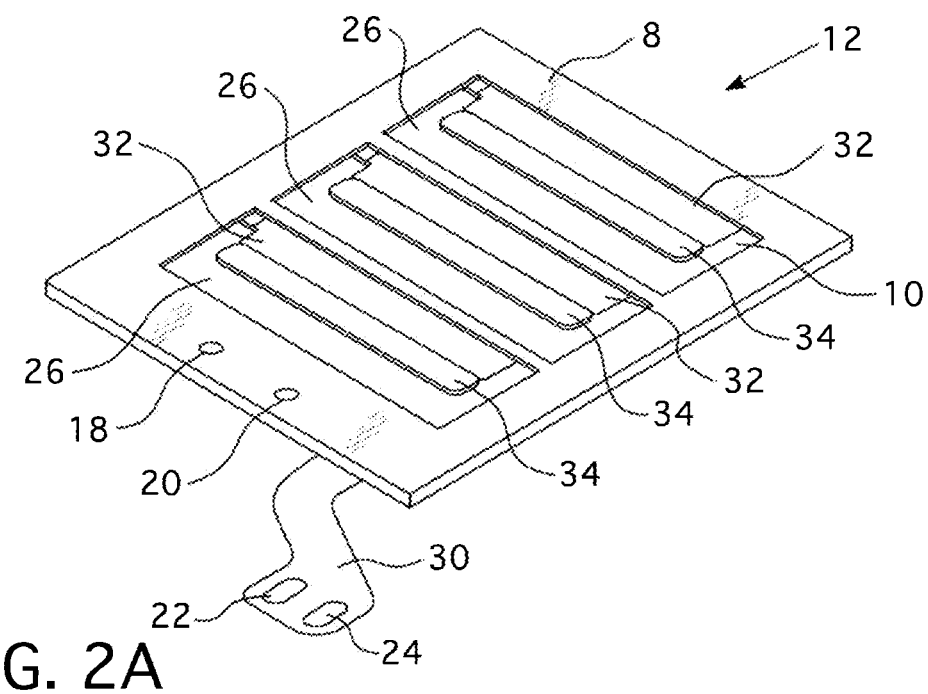
FIG. 2A illustrates an exemplary electroactive polymer cartridge.

FIG. 2A illustrates an exemplary electroactive polymer cartridge 12 having an electroactive polymer transducer film 26 placed between rigid frame 8 where the electroactive polymer film 26 is exposed in openings of the frame 8. The exposed portion of the film 26 includes two working pairs of thin elastic electrodes 32 on either side of the cartridge 12 where the electrodes 32 sandwich or surround the exposed portion of the film 26. The electroactive polymer film 26 can have any number of configurations. However, in one example, the electroactive polymer film 26 comprises a thin layer of elastomeric dielectric polymer (e.g., made of acrylate, silicone, urethane, thermoplastic elastomer, hydrocarbon rubber, fluoroelastomer, copolymer elastomer, or the like). When a voltage difference is applied across the oppositely-charged electrodes 32 of each working pair (i.e., across paired electrodes that are on either side of the film 26), the opposed electrodes attract each other thereby compressing the dielectric polymer layer 26 therebetween. The area between opposed electrodes is considered the active area. As the electrodes are pulled closer together, the dielectric polymer 26 becomes thinner (i.e., the Z-axis component contracts) as it expands in the planar directions (i.e., the X- and Y-axes components expand) (See FIG. 1B for axis references). Furthermore, in variations where the electrodes contain conductive particles, like charges distributed across each electrode may cause conductive particles embedded within that electrode to repel one another, thereby contributing to the expansion of the elastic electrodes and dielectric films. In alternate variations, electrodes do not contain conductive particles (e.g., textured sputtered metal films). The dielectric layer 26 is thereby caused to deflect with a change in electric field. As the electrode material is also compliant, the electrode layers change shape along with dielectric layer 26. As stated hereinabove, deflection refers to any displacement, expansion, contraction, torsion, linear or area strain, or any other deformation of a portion of dielectric layer 26. This deflection may be used to produce mechanical work. As shown, the dielectric layer 26 can also include one or more mechanical output bars 34. The bars 34 can optionally provide attachment points for either an inertial mass (as described below) or for direct coupling to a substrate in the electronic media device.

In fabricating a transducer, an elastic film 26 can be stretched and held in a pre-strained condition usually by a rigid frame 8. In those variations employing a four-sided frame, the film can be stretched bi-axially. It has been observed that pre-strain improves the dielectric strength of the polymer layer 26, thereby enabling the use of higher electric fields and improving conversion between electrical and mechanical energy, i.e., the pre-strain allows the film to deflect more and provide greater mechanical work. Preferably, the electrode material is applied after pre-straining the polymer layer, but may be applied beforehand. The two electrodes provided on the same side of layer 26, referred to herein as same-side electrode pairs, i.e., electrodes on the top side of dielectric layer 26 and electrodes on a bottom side of dielectric layer 26, can be electrically isolated from each other. The opposed electrodes on the opposite sides of the polymer layer form two sets of working electrode pairs, i.e., electrodes spaced by the electroactive polymer film 26 form one working electrode pair and electrodes surrounding the adjacent exposed electroactive polymer film 26 form another working electrode pair. Each same-side electrode pair can have the same polarity, whereas the polarity of the electrodes of each working electrode pair is opposite each other. Each electrode has an electrical contact portion configured for electrical connection to a voltage source.

In this variation, the electrodes 32 are connected to a voltage source via a flex connector 30 having leads 22, 24 that can be connected to the opposing poles of the voltage source. The cartridge 12 also includes conductive vias 18, 20. The conductive vias 18, 20 can provide a means to electrically couple the electrodes 8 with a respective lead 22 or 24 depending upon the polarity of the electrodes.

The cartridge 12 illustrated in FIG. 2A shows a 3-bar actuator configuration. However, the devices and processes described herein are not limited to any particular configuration, unless specifically claimed. Preferably, the number of the bars 34 depends on the active area desired for the intended application. The total amount of active area e.g., the total amount of area between electrodes, can be varied depending on the mass that the actuator is trying to move and the desired frequency of movement. In one example, selection of the number of bars is determined by first assessing the size of the object to be moved, and then the mass of the object is determined. The actuator design is then obtained by configuring a design that will move that object at the desired frequency range. Clearly, any number of actuator designs is within the scope of the disclosure.

An electroactive polymer actuator for use in the processes and devices described herein can then be formed in a number of different ways. For example, the electroactive polymer can be formed by stacking a number of cartridges 12 together, having a single cartridge with multiple layers, or having multiple cartridges with multiple layers. Manufacturing and yield considerations may favor stacking single cartridges together to form the electroactive polymer actuator. In doing so, electrical connectivity between cartridges can be maintained by electrically coupling the vias 18, 20 together so that adjacent cartridges are coupled to the same voltage source or power supply.

Figure 2B:
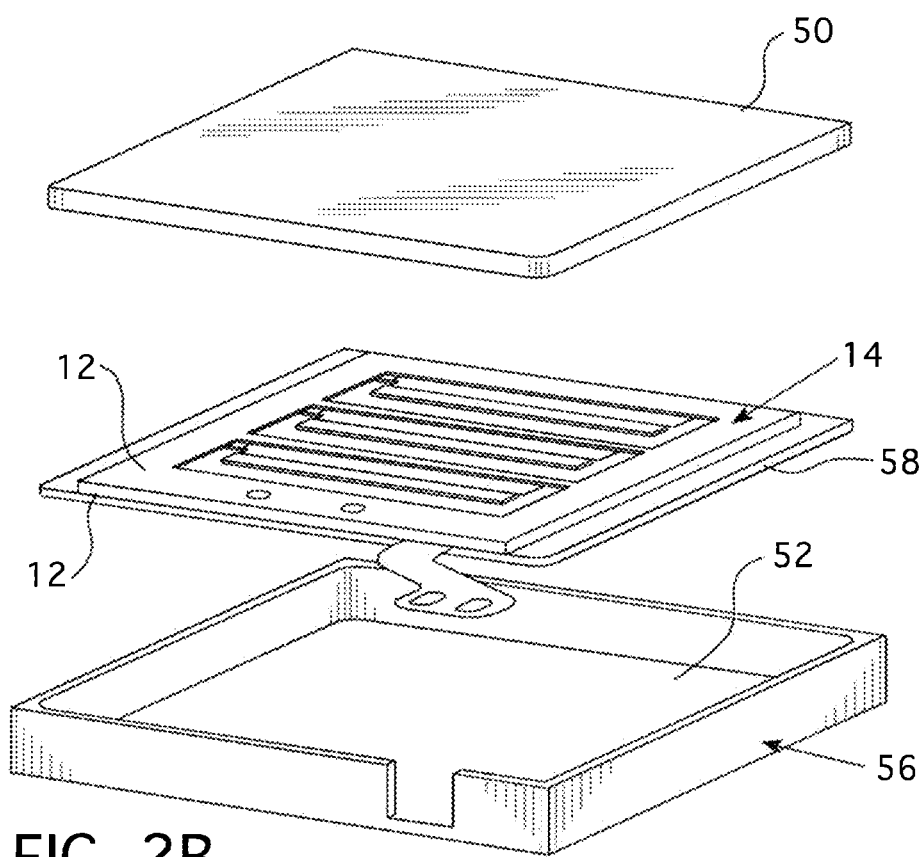
FIG. 2B illustrates an exploded view of an electroactive polymer actuator, inertial mass and actuator housing.

The cartridge 12 shown in FIG. 2A includes three pairs of electrodes 32 separated by a single dielectric layer 26. In one variation, as shown in FIG. 2B, two or more cartridges 12 are stacked together to form an electroactive actuator 14 that is coupled to an inertial mass 50. Alternatively, the electroactive actuator 14 can be coupled directly to the electronic media device through a temporary attachment plate or frame. As discussed below, the electroactive actuator 14 can be placed within a cavity 52 that allows for movement of the actuator as desired. The pocket 52 can be directly formed in a housing of a haptic case. Alternatively, pocket 52 can be formed in a separate case 56 positioned within the housing of the device. If the latter, the material properties of the separate case 56 can be selected based upon the needs of the actuator 14. For example, if the main body of the haptic housing assembly is flexible, the separate case 56 can be made rigid to provide protection to the electroactive actuator and/or the mass 50. In any event, variations of the device and processes described herein include size of the cavity 52 with sufficient clearance to allow movement of the actuator 14 and/or mass 50 but a close enough tolerance so that the cavity 52 barrier (e.g., the haptic housing or separate case 56) serves as a limit to prevent excessive movement of the electroactive actuator 14. Such a feature prevents the active areas of the actuator 14 from excessive displacement that can shorten the life of the actuator or otherwise damage the actuator.

Additional examples of electroactive polymer films can be found in the commonly assigned patents and patent applications disclosed and incorporated by reference herein. Roll-to-roll manufacturing is a desirable way to produce high volumes of electroactive polymer devices. Roll-to-roll manufacturing comprises providing the unprocessed stock film material in a roll form, processing the material as the stock material unrolls and ultimately singulating the finished electroactive polymer devices at the conclusion of the assembly process. One can also have a roll-to-sheet process where the film is advanced by sections in a step-and-repeat fashion. The line is organized as a series of processing stations, and a film section is advanced from station to station along the web.

The final configuration of the electroactive polymer films presents challenges when trying to produce these films in high volume. For example, the materials are preferably pre-strained to a specific, well-controlled degree prior to assembly. Maintenance of a consistent web speed and tension and registration of multiple printing or patterning steps are especially difficult on a deformable substrate. Also, elastomeric materials are often prone to damage during the manufacturing process and this damage can limit performance and reliability of the finished film.

To address these concerns and limitations, a novel process for producing electroactive polymer devices addresses the issues discussed above. In one variation the process includes separating the stock film material 300, typically a silicone from a release liner (i.e., a liner of material that prevents the film from sticking together). Although, the stock film material 300 may comprise any material used for fabrication of electroactive polymer devices, such as disclosed in the references incorporated by reference herein. The roll-to-roll process can include rollers treated to release the stock film material 300 as it passes through the various manufacturing processes. For example, such treatment can include TEFLON coatings or other release (or non-stick) coatings that prevents the film from adhering to the roller. The rollers may also be covered with an intermediary layer such as an engineered surface, a removable liner, a compliant layer, or a deformable layer. Examples of engineered surfaces include, but are not limited to, parchment paper, texture surfaces, screen mesh, non-stick surfaces, and polymer sheets. Examples of deformable layers include, but are not limited to, foams and soft network materials such those made from ethylene vinyl acetate, silicone and polyurethanes. In an alternate variation, the process can include replacing the roll of the stock film material 300 with a feed direct from an extrusion or other manufacturing process that directly produces the film material 96.

As the film material 96 unwinds from the stock roll 300, a release liner 330 that separates layers of the film material 96 can be rewound 302. As noted herein, the film material 96 may be pre-strained. In the illustrated variation the film material 96 is stretched in a machine direction (direction parallel to the travel of the material 96) using, for example rollers 302 travelling at different speeds. The material 96 is then stretched in a transverse direction using a separate mechanism 304. Variations include simultaneously stretching the material 96 in a machine and transverse direction (i.e., bi-axial stretchers). The desired stretch will depend upon the application as well as the desired performance of the electroactive polymer device. For example, the material can be stretched 30% in either or both the machine and transverse direction.

In some cases, it may be desirable to provide a layer of support to the film 96 after stretching. If so, a lamination layer 308 can be added to the film 96 to provide additional support for processing of the film. As discussed below, the lamination 308 also serves to reduce the occurrence of breaks in the film 96 as well as limit the breakage areas to non-critical sections of the film 96. This lamination layer 308 is sometimes referred to as a "rip-stop" layer or film. The rip-stop lamination layer may also include any number of openings that allow for further processing of the film 96. Though not shown, any number of cutouts can be included in the rip-stop layer 308 as long as the ability to provide support is not lost and the film 96 does not buckle during processing. The rip-stop layer 308 may comprise any number of polymeric materials, including polyethylene terephthalate, polyester and polycarbonate. The rip-stop layer 308 may have a surface treatment to optimize its interaction with the film 96. To provide sufficient support and tear resistance, the rip-stop layer 308 should have good surface blocking or bond to the film 96. Accordingly, the rip-stop layer 308 can be laminated to the film 96 using an adhesive layer, coatings, or tape. Preferably, the rip-stop layer 308 may include openings that allow for further processing of the film 96 into the electroactive polymer device. These openings may be created by any conventional process such as stamping, cutting, etching, etc. Although the laminated film 96 with rip-stop 308 can proceed through the manufacturing process, as illustrated in FIG. 3A, alternate variations of the process can include re-winding the film 96 after lamination with the rip-stop layer 308.

A printed layer can be used as an alternative to a laminated rip-stop layer. The printed material can be any material that can be applied to the film and cured or dried in place that is tougher and more tear resistant than the film. Examples of suitable materials include, but are not limited to, polyurethanes, silicones, acrylates, and epoxy systems.

Next, the film 96 with rip-stop 308 is fed through one or more electrode printing assemblies 310. The electrode printing assembly 310 may also optionally print the bus bar connection for the electrodes on both sides of the film 96. Any number of web-printing processes can produce the electrodes necessary for the electroactive polymer device, including flexographic printing, gravure (also called rotogravure or roto printing), screen printing, rotary screen printing, ink jet printing, aerosol jet printing, etc. The printing process may be adjusted for the offset caused by the openings in the rip-stop layer (for example, the print rollers can have raised bosses that are timed to print on the unlaminated portion of the film 96). Furthermore, registration of the film 96 web positions may be necessary to ensure electrodes are printed within the openings of the rip-stop lamination as well as on the web of film 96. Any such registration commonly used in printing or similar applications may be applied to the process disclosed herein.

FIG. 3A also illustrates printing occurring on both surfaces of the film 96. As noted above, electrode placement is required on each side of the film 96. In alternate variations of the process, printing can occur on a single side of the film 96, which is then rewound and reprocessed with printing occurring on the opposite side in a subsequent process. Alternatively, the single-sided printed film may be stacked or laminated where the single electrode can be used to service two adjacent films in a multilayer stack. In any case, registration may be necessary to ensure that printing of electrodes on opposing sides of the film material and on different sections of the film is within manufacturing tolerances.

Once the electrodes are placed on the film 96, the film 96 can be re-wound 312 with an interleaf or separation layer 314 positioned between layers of the film 96. Alternatively, the film 96 can continue for additional processing to assemble the electroactive polymer frame and support structures as described herein.

FIG. 3B illustrates an example of further processing of the printed elastomeric film 96 material in a process that produces a double layered electroactive polymer device. As shown, two sources of the printed film 96 can be fed 316 or unwound and joined to form a double layer of electroactive polymer film 96. The film may optionally be bonded or laminated depending upon the desired application. Next, one or more cartridge frames 318 may be added or bonded to the film 96 on both sides of the double layered electroactive polymer film 96. In addition to placement of the frames, one or more output bars or center discs 320 may be positioned by each electrode on the opposing sides of the double layer electroactive polymer film 96. Structural elements such as flexures may also be placed onto the film. Additional printing stations may be used to print adhesives or structural materials for the frames, flexures, and output bars. Finally, the finished electroactive polymer devices can be removed from the web (e.g., die cut, punched, laser cut, etc.). Clearly, variations of the process may include removal of the materials after any stage of processing so the device can be completed in a batch process rather than on the conveyor assembly system. Moreover, variations of the process include re-winding of the finished electroactive polymer device for subsequent removal.

In an alternate variation, a process for fabricating an electroactive polymer device may include UV, thermal, or surface treatment of the elastomeric polymer. The present inventors have found that UV treatment of the film prior to depositing electrodes on the film results in improved stroke performance of the finished actuator. While not wishing to be bound to any particular theory, the present inventors believe UV exposure, silicone, polyurethane, acrylate, hydrocarbon rubber, olefin copolymer, polyvinylidene fluoride copolymer, fluoroelastomer, styrenic copolymer, and adhesive elastomer may change the surface energy of the film to improve uniformity of the electrode deposition. Further, the inventors speculate that UV curing may change the bulk modulus or other properties of the elastomer making it more compliant and UV treatment may modify residual functional groups in the polymer film that cross-link during thermal loading in the manufacturing process.

Regardless of the actual mechanism, the present inventors have found UV curing is an effective treatment to improve the stroke performance of actuators. In one example, UV curing improved a pulse response of an actuator by 20% and characterized the actuators with lower resonant frequency as compared to a non-UV cured elastomer. The parameters for UV curing will vary depending on a number of factors and the desired application of the end electroactive polymer device. In one example, it was found that UV curing of 6.5-7.0 $J/cm^2$ was an optimum point of UV treatment that improved stroke performance for actuators. Another unexpected benefit of UV curing (prior to deposition of electrodes) is that the queue time between UV curing and electrode printing was not a sensitive factor. In the study conducted by the present inventors, the queue time could last as long as 25 days. This finding may potentially allow for UV curing during or immediately after pre-straining the film. In some cases, it may be possible to treat the elastomer during film manufacture so that the benefits are retained from when the elastomeric film is made to when the film is processed as described herein.

One of the problems with attempting to use roll-to-roll manufacturing for elastomeric films (such as silicone) is that the film is relatively thin (e.g., 23 µm) while having a very low modulus. The compliant film cannot remain flat without applying pre-strain but at the same time, the film can tear or break easily. Furthermore, to ensure that the device is manufactured to meet high actuator performance, the film requires a high level of applied strain during printing and lamination. Without a frame to hold and maintain the pre-strain, the electrode pattern printed on the film has a high chance of deforming and registration of the printed patterns is likely to be poor. If the film deforms during the printing operations, the film may be rendered non-functional for use in the electroactive polymer actuators.

To address this issue, a variation of the inventive manufacturing process includes applying a uni-axial pre-strain to the electroactive polymer film. Experiments have shown that uni-axial strain can match the stroke performance of regular bi-axial pre-strained films under certain conditions.

Uni-axial pre-strain magnitude can be defined by an index of thickness, the same as biaxial pre-strain after stretching. For example, uni-axial strain (67% thickness direction and 0% strain in XY direction) and biaxial strain (30% in two directions) can have similar film thickness ranges. The longer output bar direction is parallel to the uni-axial pre-strain direction.

Figure 4A:
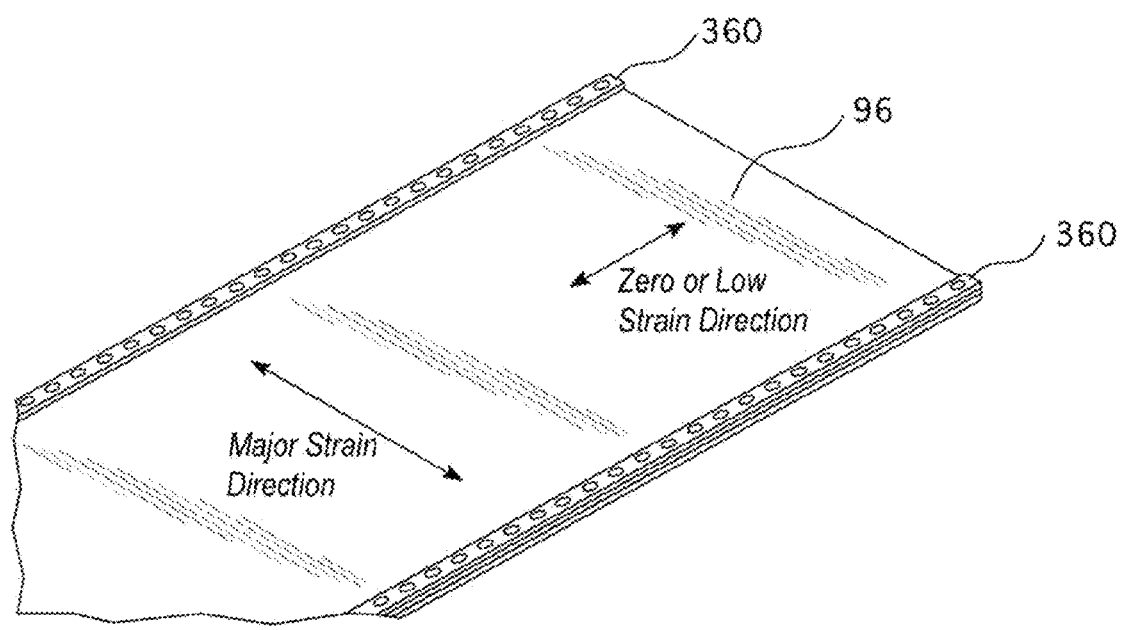
FIGS. 4A to 4D illustrate an example of using a stiff belt member to assist in controlling the desired strain on an elastomeric film.
Figure 4B:
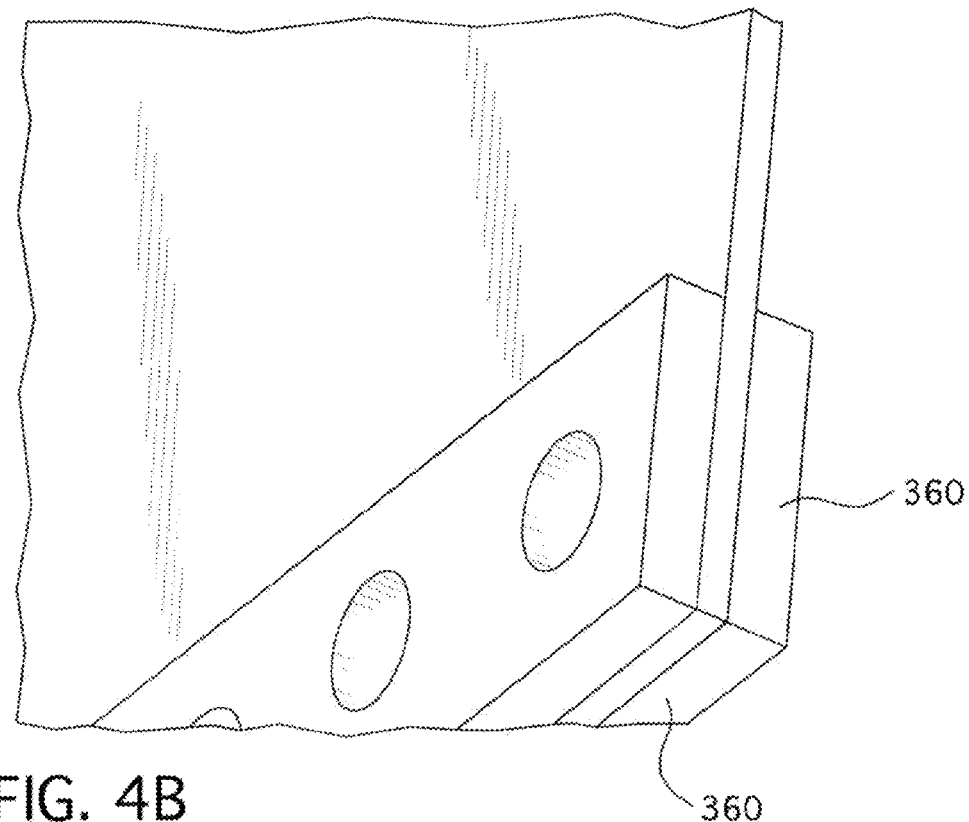
Figure 4C:
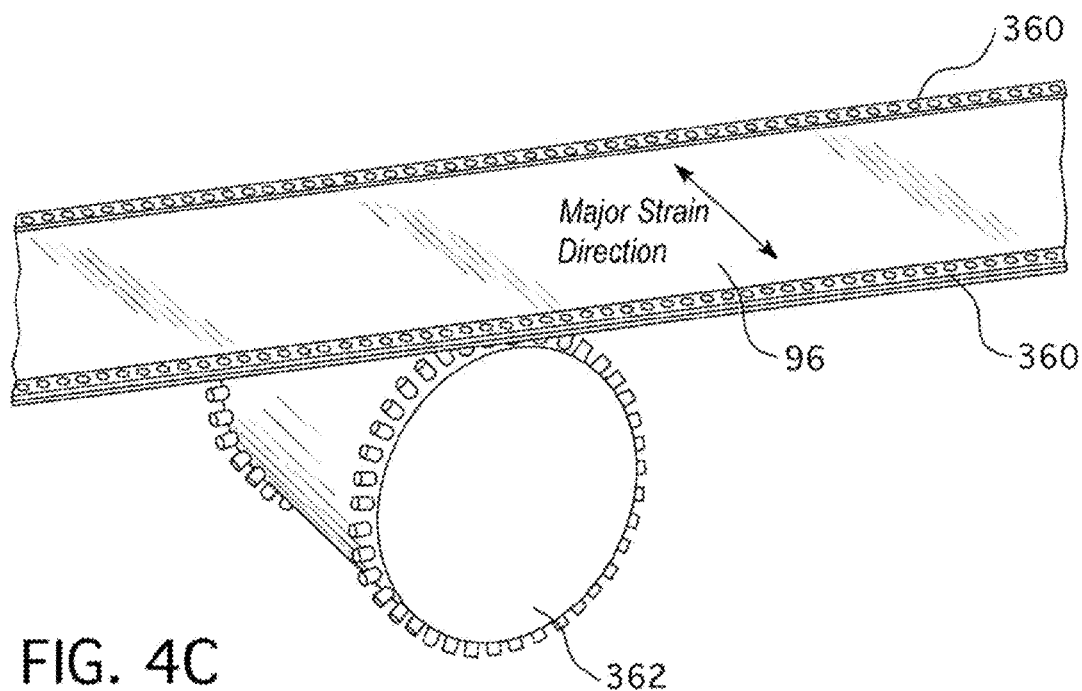
Figure 4D:
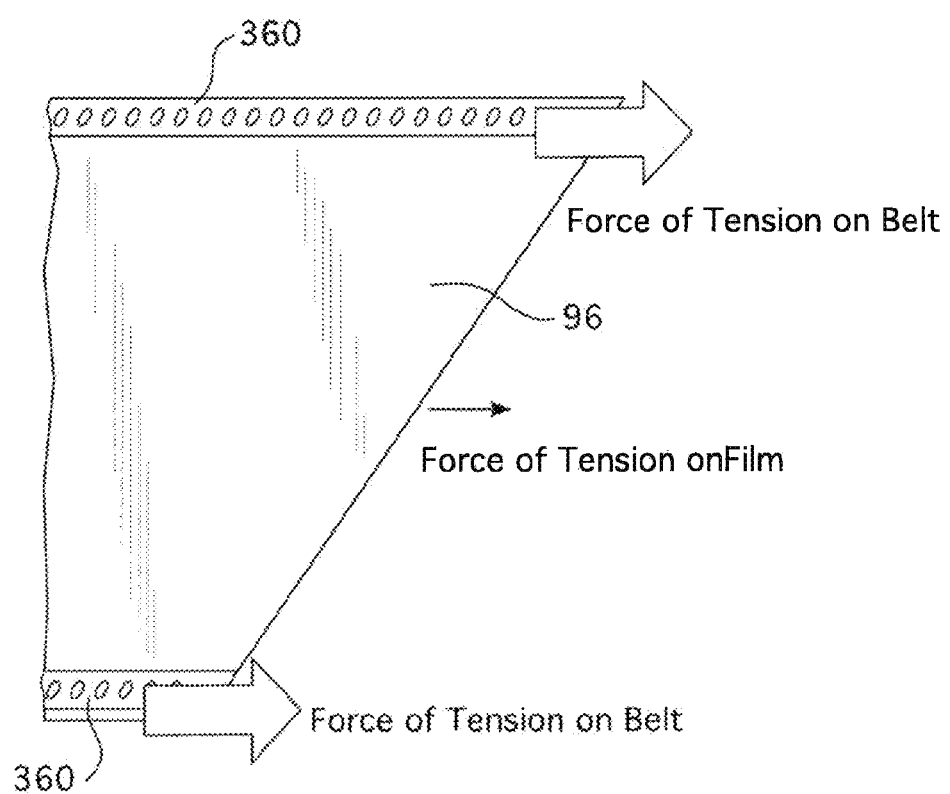

To achieve uni-axial pre-strain in a roll-to-roll system, perforated belts 360, as shown in FIGS. 4A and 4B, may be used to hold the two edges of the elastomeric film 96 in the web (longitudinal) direction. The uni-axial strain may be applied by stretching the film in lateral direction, while in the web direction there is zero or low pre-strain. The output bar of the electroactive polymer cartridge can be designed to be perpendicular to the web direction. One variation of the process includes the use of perforation (or sprocket or pin-fed) rollers to hold the belts and film while controlling the degree and direction of strain (See FIGS. 4C and 4D).

The lateral and longitude position of the belts 360 can be controlled precisely through the perforation rollers so the local strain will be consistent and stable. This allows for multiple printing and curing steps as described herein. The major strain is defined by the distance between two belts 360 on the two long edges of elastomeric film 96.

The belts 360 may be constructed from a material that is much stiffer than the elastomeric film. For example, the belts 360 can comprise polyethylene terephthalate, which has a Young's Modulus between 2800-3100 MPa and tensile strength is 55-75 MPa. In contrast, silicone (a common material for the elastomeric film) has Young's Modulus of 1-5 MPa and tensile strength is 5-8 MPa. Accordingly, polyethylene terephthalate is about 1000 times stiffer than silicone film.

When applying tension through the rollers 362, the majority of force will be applied to the polyethylene terephthalate belt 360 rather than the film 96. For example, assuming 5% elongation on the web, 400 out of 401 parts of force is applied on the polyethylene terephthalate belt while 1 part is applied on silicone film (assuming polyethylene terephthalate is 50 µm thick and 25 mm wide; while silicone film is 25 m thick and 500 mm wide). This avoids the need to use tension rollers directly on the silicone film to control the strain of the film. If tension rollers were used, any small change in tension applied to the silicone film would lead to a great change in film elongation which would be difficult to control.

Biaxial stretching may be accomplished with perforated belts if the belts are constructed of stretchable material or are segmented, e.g. with perforated lines, so sections of the belt can separate upon stretching along the web direction while remaining engaged with the perforated rollers or guide chains along the edge of the web.

Figure 5A:
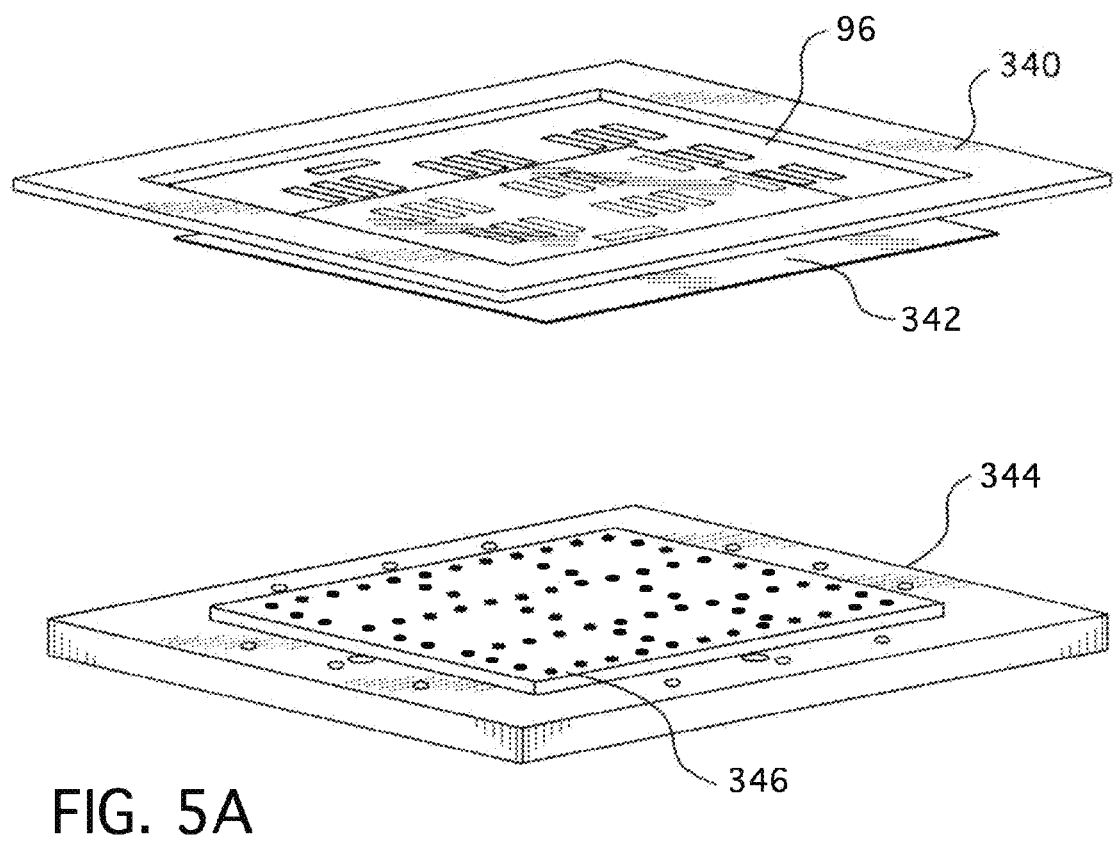
FIG. 5A illustrates a variation of a printing process useful in manufacturing electroactive polymer actuators.

FIG. 5A illustrates a variation of a printing process useful in manufacturing electroactive polymer transducers. This process can be especially useful in large volume manufacturing of the transducers. FIG. 5A illustrates a configuration used in a screen print process for large volume manufacturing of electroactive polymer actuators. In this variation, an elastomeric film 96 is held in a frame 340 with a liner 342 that is attached to the backside of the film. The liner 342 assists in release of the film 96 from the aluminum vacuum tooling 344 after the screen printing process. The liner 342 also serves to stabilize the film 96, which improves control over dimensional tolerances of the printed film 96. Although liners 342 are effective, the use of the liners may increase process time, setup time, and cost while reducing throughput of the manufacturing process. Furthermore, increased handling of the electroactive polymer film, from applying and removing the liners, can increase the chances of damage to the film. Moreover, the liners can damage the film if the liner does not release easily or if air or other particles become trapped between the film and the liner.

Figure 5B:
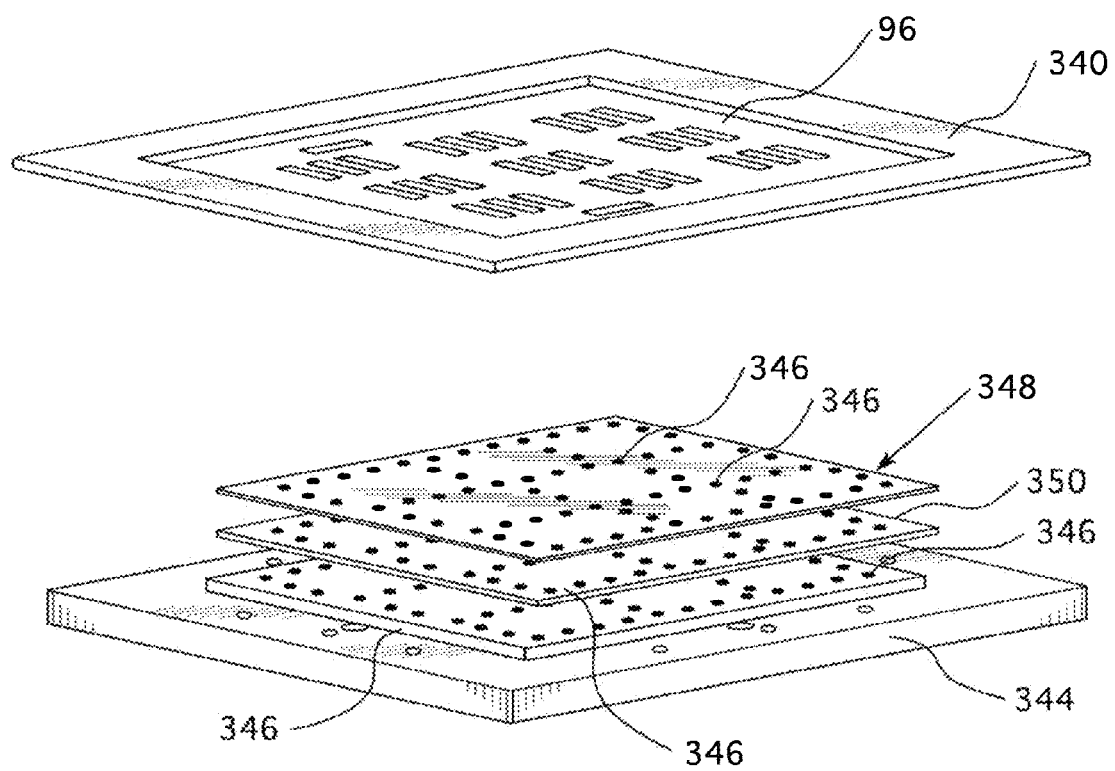
FIG. 5B illustrates a variation of a printing configuration that eliminates the requirement of a liner similar to that shown in FIG. 5A.

FIG. 5B illustrates a variation of a printing configuration that eliminates the requirement of a liner similar to that shown in FIG. 5A. In this variation the electroactive polymer film 96 remains secured to a frame. The setup also includes a base plate (e.g. constructed from aluminum or a similar material) having vacuum openings 346 used to retain the film 96. The variation illustrated in FIG. 5B includes an engineered top surface 348 (e.g., parchment paper, screen mesh, polymer sheet, textured surface, non-stick surface, or a similar material). The engineered surface 348 should have sufficient tack properties that it holds tolerance, provides differential release from the screen, and releases the elastomeric film 96 after the printing process. The printing configuration also may include a compliant intermediate layer 350 that creates a relatively soft, firm, and level surface for printing. The compliant layer 350 may include a very high bond adhesive, rubber, or other similar material. As illustrated, the print tooling configuration may include vacuum apertures 346 to assist in holding the film 96 in place during printing and to ease release (via cessation of the vacuum force).

Figure 5C:
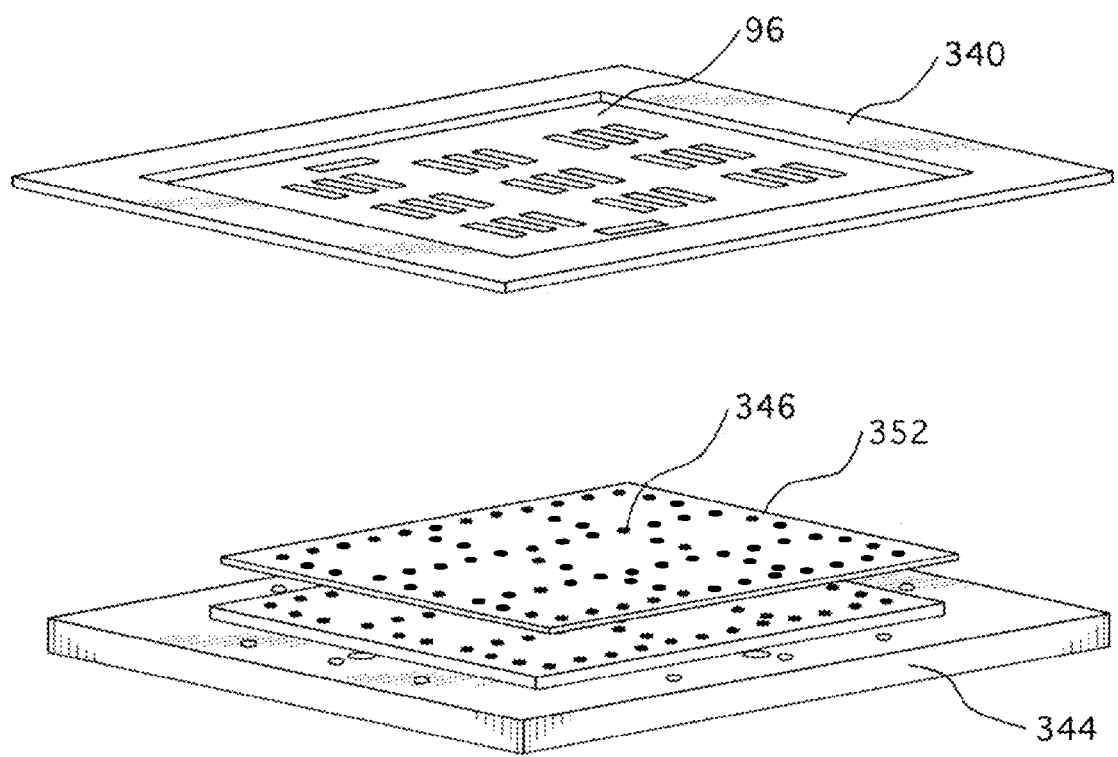
FIG. 5C demonstrates yet another variation of a tooling configuration where the film contacts a foam layer directly without the use of any layer as shown in FIGS. 5A and 5B.

FIG. 5C demonstrates yet another variation of a tooling configuration used for screen printing of the film 96. In this variation, the film 96 contacts a deformable layer such as a foam sheet 352 directly without the use of any type of layer such as the engineered surface or the liner described in FIGS. 5A and 5B. The deformable layer provides a soft tooling effect and may comprise a material such as ethylene vinyl acetate foam. In one example, the deformable layer comprises an ethylene-vinyl acetate film with 2 mm thickness and a 75+/−5 Shore 00 hardness. Other soft materials such as silicones and polyurethanes may also be used. The deformable layer may have a textured or treated surface to aid in its release properties from the film. As with the other variations, the foam layer 352 includes a plurality of vacuum holes that help secure the film 96 to the foam and release the film upon cessation of the vacuum force. With some open-celled foams, vacuum holes may not be needed.

Figure 6:
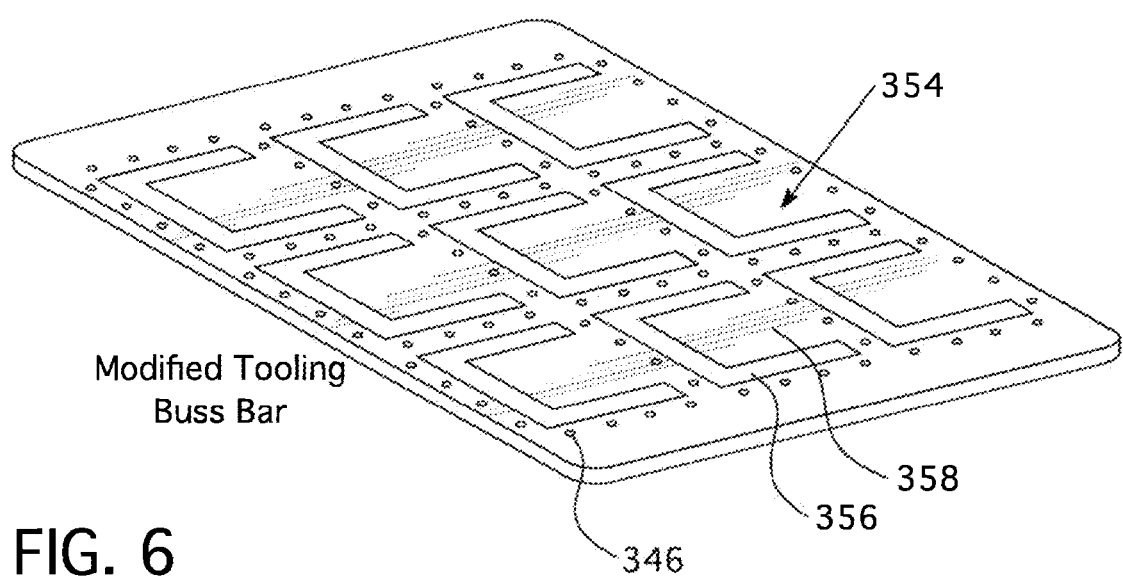
FIG. 6 shows an etched foam layer that allows for deposition of varying ink levels in the same printing process.

The soft tooling described in FIG. 5C above provides an additional benefit by allowing formation of patterns which aid in the manufacturing process. For example, as shown in FIG. 6, the foam layer may be etched to produce a pattern 356 that is related to the design of the feature or part being printed on the elastomeric film. The illustration shown in FIG. 6 relates to a pattern 356 that assists in creating a bus bar on the electroactive polymer device. As the modified tooling 354 contacts the film (not shown in FIG. 6), the compression of the soft tooling allows for differential pressure zones based on the depth and/or size of the pattern 356. For example, in the modified soft tooling 354 shown the regions containing the patterns 356 will create zones of lower pressure than the continuous regions 358. Accordingly, during screen printing, the lower pressure zones will result in greater print thickness compared to the remainder of the printed electrode. The ability to perform multiple thickness printing in one step has the potential to improve throughput as compared to needing sequential printing steps.

Apart from improving efficiency, the ability to produce areas of varying thickness also results in improved device performance. For example, in one example, printing of a thicker bus bar with modified soft tooling resulted in a bus bar resistivity that was four times lower than resistivity of the bus bar produced with unmodified soft tooling. Generally, the depth of the pattern is calculated based on the initial print pressure, tooling hardness and ink viscosity. In one example, the depth of the patterns ranged between 150-200 µm for electrode ink given a 1.7 mm ethylene vinyl acetate foam.

Any of the tooling configurations discussed above may optionally include additional materials that enhance maintenance, serviceability, or improve performance. Examples of such materials include, but are not limited to, coatings, adhesives, release agents, etc. These tooling configurations may also be used to print inks other than conductive electrode inks and print onto deformable substrates other than those used for electroactive polymer transducers.

Figure 7A:
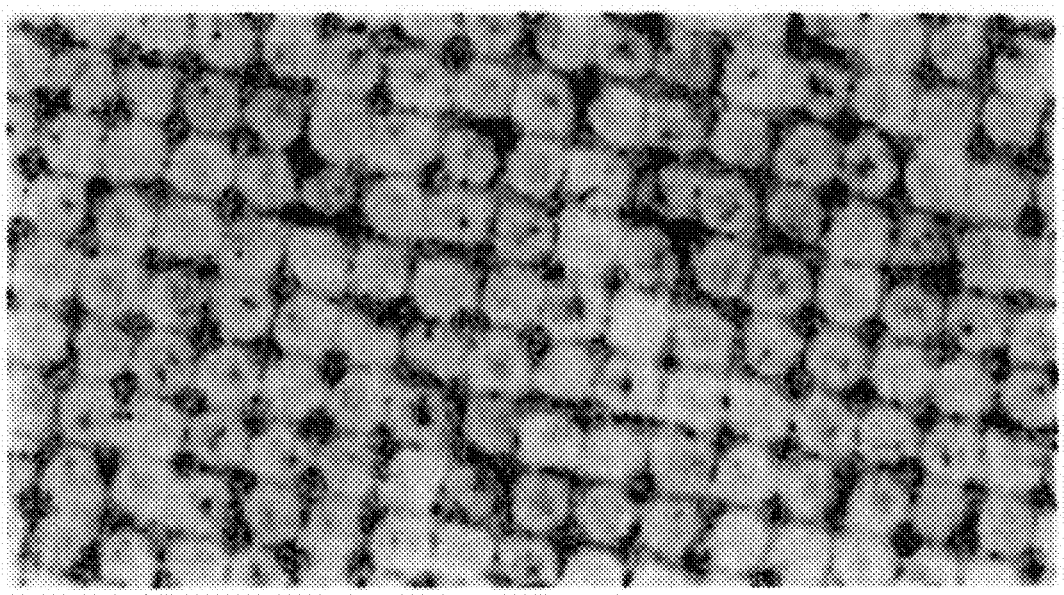
FIG. 7A depicts the square patterned microstructure of an electroactive polymer film which has been screen printed.
Figure 7B:
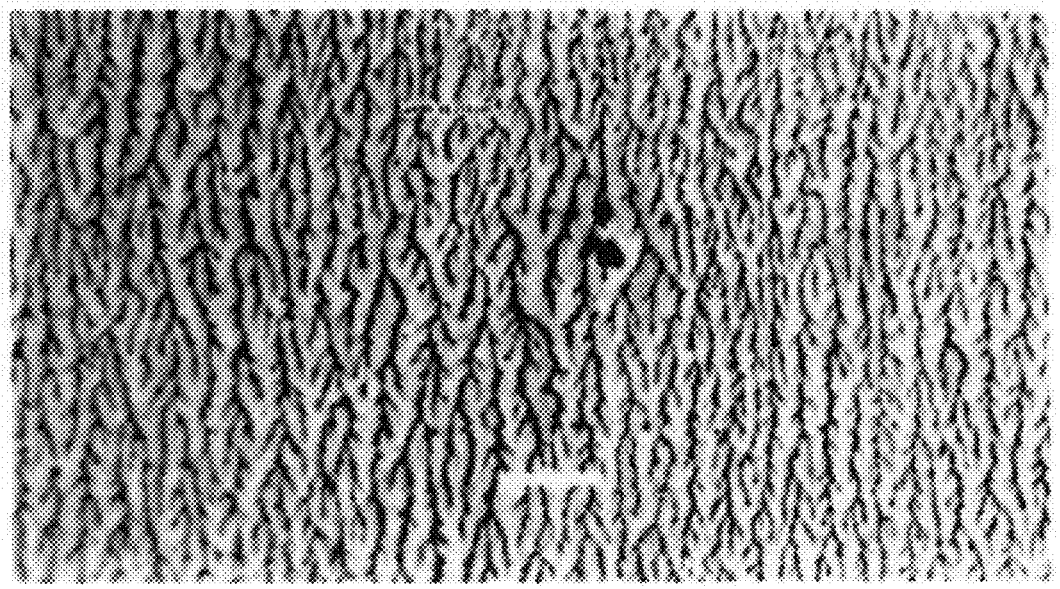
FIG. 7B shows the fibrillated microstructure of an electroactive film printed by flexographic printing.

In another embodiment of the present invention a fibrillated (net) microstructure that demonstrates extra stability in sheet resistance under large strain cycles is provided. An electroactive polymer structure comprises a dielectric polymer film and two compliant electrodes. When a voltage is applied across the electrodes, the film contracts and expands in area. Flexographic printing, rather than screen printing, can produce a fibrillated (or net) microstructure as shown in FIG. 7B. Comparing the square pattern microstructure (shown in FIG. 7A) made by screen printing with this net microstructure resulting from flexographic printing in conjunction with Table 1, reveals a significant improvement in the consistency of sheet resistance, using the same dielectric polymer film and the carbon ink in the two processes.

The preferred flexographic layers are: rip-stop/electrode/ bus bar/adhesive/pressure sensitive adhesive. To build up such a robust structure, the conductivity of electrodes should be kept consistent under cycling strain. Sheet resistance can vary from 25 k to 125 k as with screen printing; with a production flexographic tool, the consistency can be well controlled.

TABLE 1

| Printing Process | Initial reading | Removal of liner | 100% XY strain manipulation for 10 times |
|---|---|---|---|
| Screen printing | 550 | 1700 | 4500 |
| Flexographic printing | 65 | 64 | 70 |

Alternatively, similar net structures may be made through control of ink surface tension, creation of proper mechanical pre-tension of the dielectric film, or taking advantage of some other printing processes, such as ink jet/aerosol jet/ curtain/slot/wire coating. The pattern on the roller is also a design factor with possibilities of cell pattern or line (curve) patterns with different angles. Controlling the density of the fibrillated structure may allow one conductive material to be used for charge distribution, with or without an additional coating of lower conductivity ink as electrodes.

The inventive fibrillated microstructure may be built up for use as electrodes or bus lines by certain printing processes or wetting/dewetting patterns from controlling the surface tension of the materials. A complicated mask or template may not be necessary to produce such a net pattern.

Figure 8:
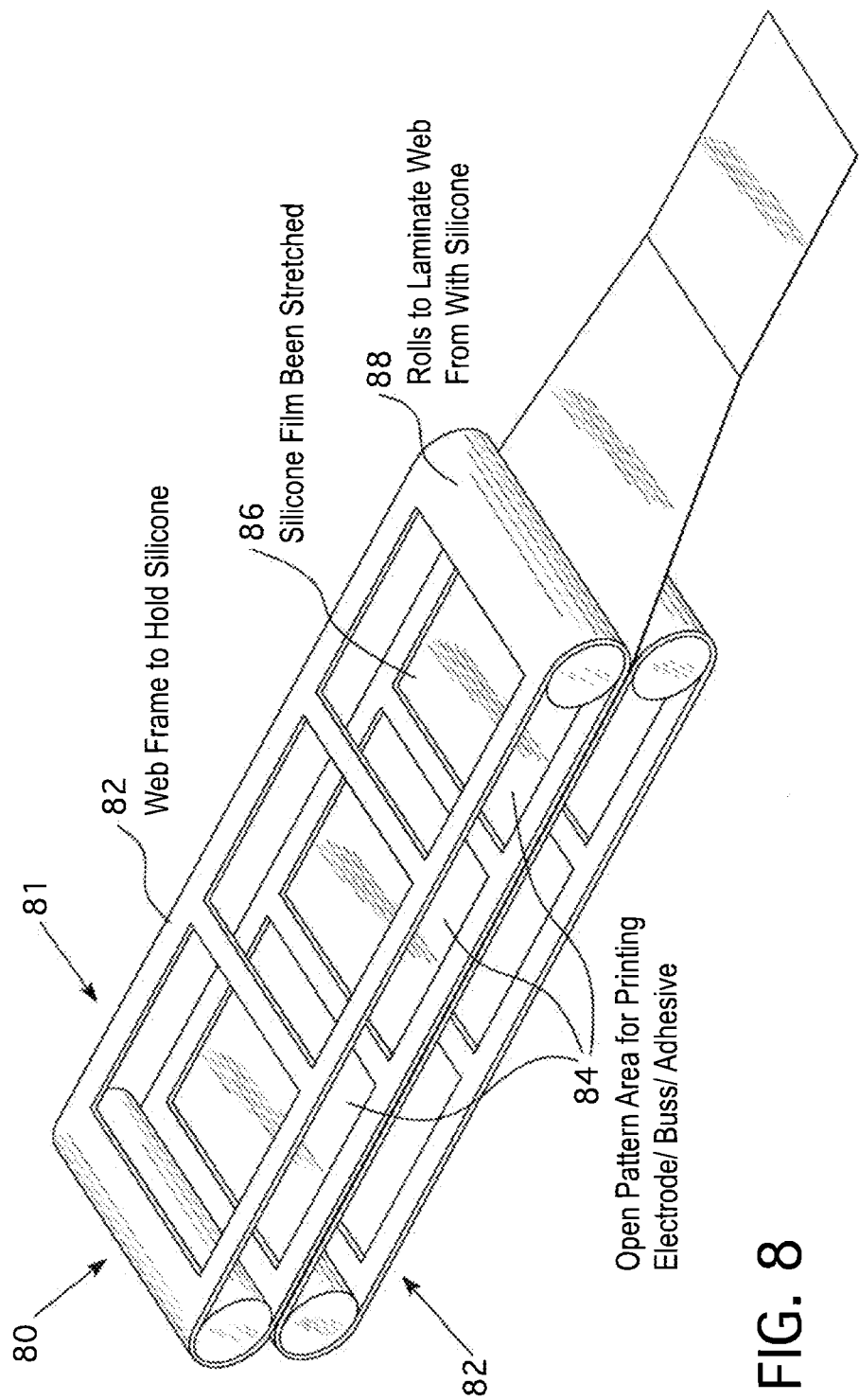
FIG. 8 illustrates the inventive process using a continuous web frame to hold pre-strained silicone film.
Figure 9:
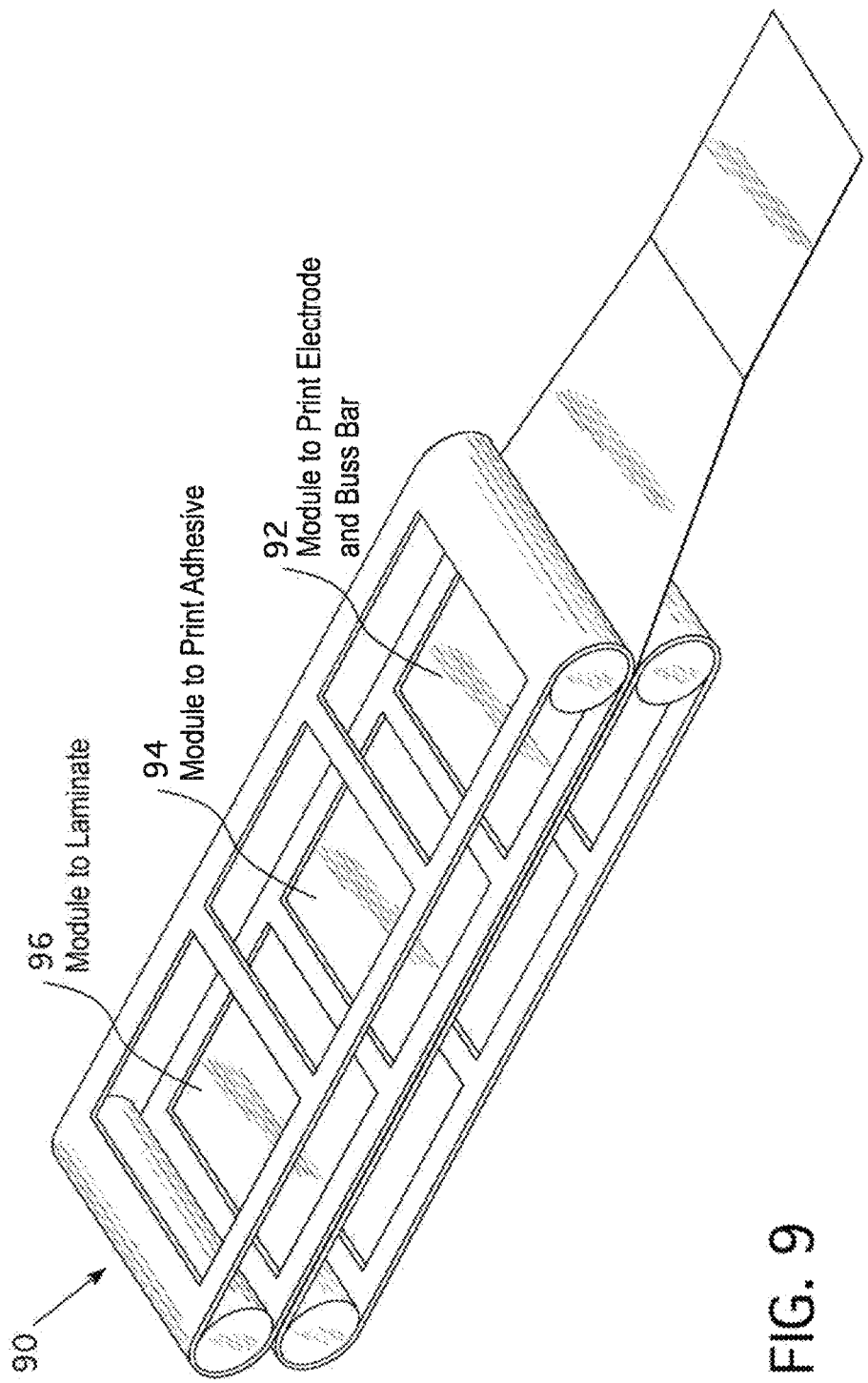
FIG. 9 demonstrates aligning several printing stations sequentially on the web.
Figure 10:
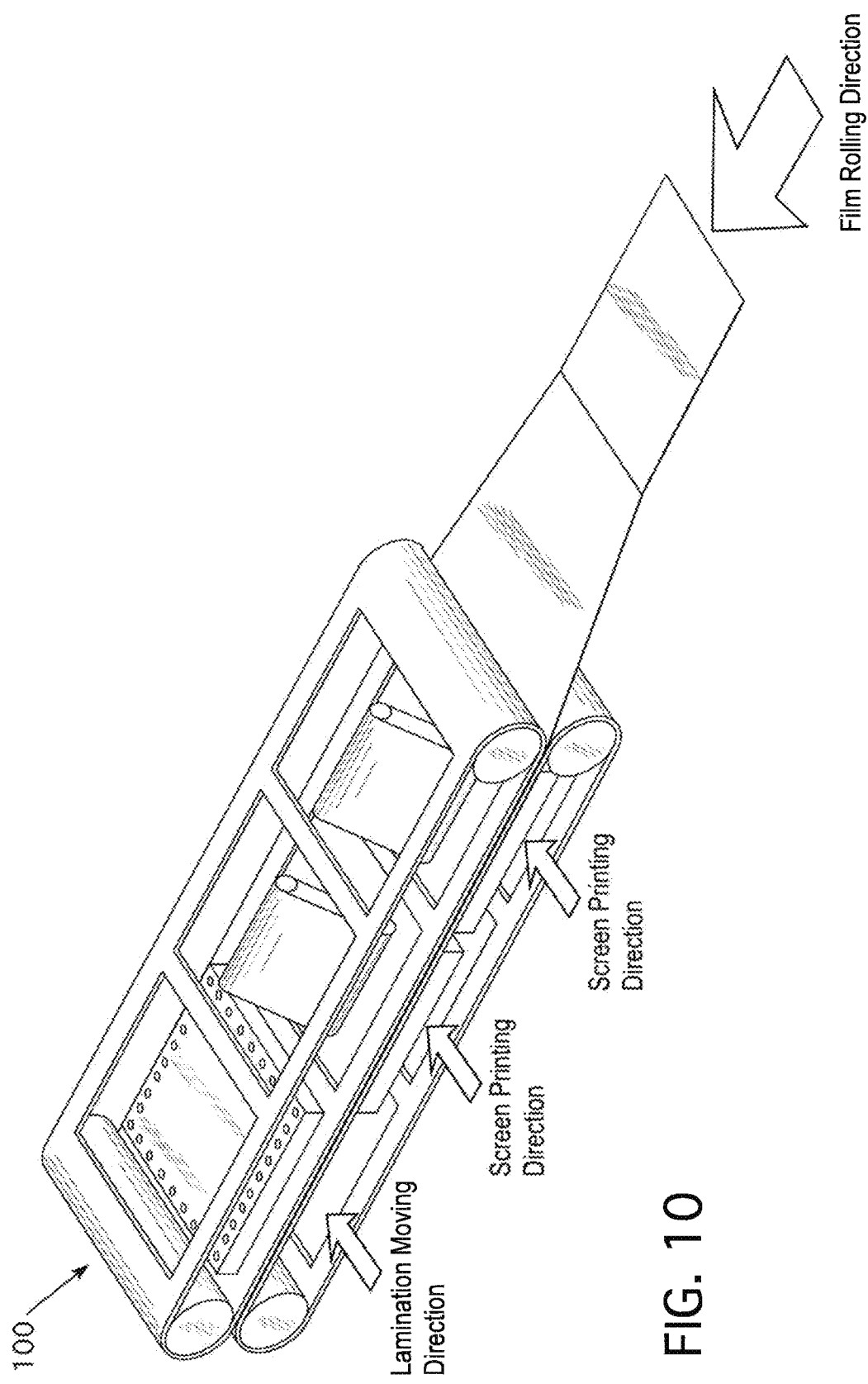
FIG. 10 illustrates one layout of the line according to the process of the present invention.

FIGS. 8-10, show the inventive concept of using a web flex frame with open precut patterns sandwich with stretched silicone film, loading of substrates for printing multiple layers, and final lamination. The substrates may be loaded continuously or advanced in a step and repeat fashion. As shown in FIG. 8, web frame 82 holds pre-strained silicone film 86 in shape without deformation during web movement. The web frame 82 is similar to a rigid aluminum frame; but the web frame is continuous with flexibility in the Z direction so it can be driven by rolls 88. There are two sets of web frames 81, 82 on the top 81 and the bottom 82 of the silicone film 86. Surface tension, blocking forces, magnetic force (permanent or electro-driven), or mechanical interlocks may be used to sandwich the silicone film between web frames 81, 82. The web frame holder material may include rubber coated metal foil as a composite material allowing flexibility in the Z direction to move as the web and rigidity in the X-Y directions to hold the film. The rubber or coating surface may be designed to be released from silicone film after lamination is completed so that the debris of silicone film after device singulation can be easily cleaned before starting another cycle.

As shown in FIG. 9, several printing stations 92, 94 may be aligned sequentially on the web 90; lamination module 196 is the last step on the web. Through the open window precut on the web frame, there is a printing station 92 to deposit inks on silicone film. The printing direction may be perpendicular to the web movement direction to conserve space so the line may be shorter. There may be curing or drying stations (not shown) between printing station(s). To save time or shorten the length of the web path, the ink may only be dried or partially cured instead of fully cured before the film moves to a subsequent printing station.

After adhesive printing 94, there is a laminating station 196 that may be arranged in a perpendicular direction as well. A rotary die cutting station (not shown) may be used to make patterns of frame layers on a roll. The pre-cut frame pattern may have pressure sensitive adhesive on one or both sides so it is ready for lamination.

An example process flow for the lamination process for a four-layer electroactive polymer transducer is as follows:
1. The precut frame layer is transferred to the lamination station as the frame top layer;
2. layer 4 with adhesive on the web frame holder is transferred to the lamination station, pressure/heat is applied and the web frame holder is removed;
3. step 2 is repeated with layers 3, 2, 1, sequentially,
4. the precut frame bottom layer is laminated to the stack.

The frame layers may be precut on a rotary die cutter. The lamination station may have a thermal heating function to pre-cure adhesive in-between layers such that each new layer adheres to previous layers tightly. After lamination, the entire sheet of cartridge stack may be sent to the curing station for final full cure and singulation with a die cutter.

The layers may have different patterns of electrode and bus bar. This may be done without introducing extra printing steps. One way to do this, for example, is to make the electrode/bus left on the left half of screen and electrode/bus right on right half of the layer. Many other combinations may be envisioned to produce this on one single continuous web.

As shown in FIG. 10, in one embodiment, layout of the line is as follows: stretching→sandwiching→printing(s)→lamination.

The web movement on the sandwiched frame-film-frame may be more complex than as illustrated. For example, a means to flip the web may be included so both sides of film may be printed with screen printing or flexographic printing. If non-contact printing is applied, such as aerosol jetting, both sides may be printed simultaneously to simplify the web design.

As for other details of the present invention, materials and alternate related configurations may be employed as within the level of those with skill in the relevant art. The same may hold true with respect to process-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth in the claims. Stated otherwise, unless specifically defined herein, all technical and scientific terms used herein are to be given as broad a commonly understood meaning as possible while maintaining claim validity.

What is claimed is:

1. A process for producing a patterned deformable polymer film for use in a deformable polymer device, the process comprising:
   supporting a deformable film section such that the deformable film section comprises a supported portion and an unsupported portion;
   positioning an intermediary layer between the unsupported portion of the deformable film and a process tooling; and
   printing at least one electrode on the unsupported portion of the deformable film by depositing an ink to form the at least one electrode on a first surface of the unsupported portion of the deformable film, wherein the intermediary layer permits release of the unsupported portion of the deformable film from the process tooling subsequent to the printing process.

2. The process according to claim 1, wherein the ink is deposited by one selected from the group consisting of screen printing, pad printing, gravure printing, ink jet printing, flexographic printing and aerosol jet printing.

3. The process according to one of claims 1 or 2, wherein the intermediary layer comprises at least one selected from the group consisting of an engineered surface, a removable liner, a compliant layer and a deformable layer.

4. The process according to claim 3, wherein the engineered surface is a surface selected from the group consisting of a parchment paper, a textured surface, a non-stick surface, screen mesh and a polymer sheet.

5. The process according to claim 3, wherein the deformable layer comprises a foam material.

6. The process according to claim 3, wherein the deformable layer comprises a plurality of cavities, wherein the cavities permit regions of varying pressure during screen printing, and wherein the process further comprises depositing ink at varying levels on the first surface of the deformable film.

7. The process according to claim 1, wherein the deformable polymer film comprises an electroactive polymer film.

8. The process according to claim 1 further comprising:
advancing a deformable film of an elastomeric material from a supply of elastomeric material;
mechanically straining the deformable film to create a first pre-strained film section remaining continuous with the supply of elastomeric material;
depositing ink to create at least a first electrode on a first side of an unsupported portion of the first pre-strained film section, wherein supporting a deformable film section comprises supporting the first pre-strained film section such that the first pre-strained film section comprises a supported portion of the first pre-strained film section and the unsupported portion of the first pre-strained film section;
depositing ink to create at least a second electrode on a second side of the unsupported portion of the first pre-strained film section opposing the first electrode and forming at least one opposing electrode pair to complete at least a first section of electroactive polymeric film; and
collecting the first section of electroactive polymeric film.

9. The process according to claim 8, further comprising:
mechanically straining the deformable film to create a second pre-strained film section remaining continuous with the deformable film;
supporting the second pre-strained film section such that the second pre-strained film section comprises a supported portion and an unsupported portion;
depositing ink to create at least a first electrode on a first side of the unsupported portion of the second pre-strained film section; and
collecting the second section of electroactive polymeric film.

10. The process according to claim 9, further comprising stacking or laminating the first and second sections of electroactive polymeric film together.

11. The process according to claim 8 further comprising applying at least one structural component selected from the group consisting of output bars, frames and flexures.

12. The process according to claim 8, wherein the film of elastomeric material comprises a first and second belt member on respective near and far edges of the film, and wherein each belt member comprises a material having a Young's Modulus greater than a Young's Modulus of the film.

13. The process according to claim 12, wherein the first and second belt members comprise perforated belt members and wherein perforation rollers are used to mechanically strain the film.

14. The process according to claim 8, wherein the film of elastomeric material is mechanically strained substantially in a direction selected from the group consisting of transverse to the direction of travel of the advancing film, parallel to the direction of travel of the advancing film, equally in transverse and parallel directions, or in an unequal combination of transverse and parallel directions.

15. The process according to claim 8, wherein the film is advanced in a stepwise fashion.

16. The process according to claim 8, wherein collecting the first section of electroactive polymer film comprises winding a plurality of sections of electroactive polymer film to form a roll of electroactive polymer films.

17. The process according to claim 16 further comprising feeding at least two rolls of electroactive polymer films into a lamination station and applying at least one selected from the group consisting of a frame, an output bar, and a flexure to at least the first layer of electroactive polymer films to assemble a multi layered electroactive polymer actuator device.

18. The process according to claim 8, wherein supporting the first pre-strained film section comprises applying a supporting layer to the first pre-strained film section.

19. The process according to claim 1, wherein the deformable film comprises a pre-strained electroactive polymer.

20. The process according to claim 1 wherein the polymer is selected from the group consisting of silicone, polyurethane, acrylate, hydrocarbon rubber, olefin copolymer, polyvinylidene fluoride copolymer, fluoroelastomer, styrenic copolymer, and adhesive elastomer.

* * * * *